(12) United States Patent
Suk et al.

(10) Patent No.: US 12,237,256 B2
(45) Date of Patent: Feb. 25, 2025

(54) SEMICONDUCTOR PACKAGE

(71) Applicant: SAMSUNG ELECTRONICS CO., LTD., Suwon-si (KR)

(72) Inventors: Kyoung Lim Suk, Suwon-si (KR);
Keung Beum Kim, Hwaseong-si (KR);
Dongkyu Kim, Anyang-si (KR);
Minjung Kim, Cheonan-si (KR);
Seokhyun Lee, Hwaseong-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 0 days.

(21) Appl. No.: 18/183,062

(22) Filed: Mar. 13, 2023

(65) Prior Publication Data
US 2023/0215799 A1    Jul. 6, 2023

Related U.S. Application Data

(63) Continuation of application No. 17/329,256, filed on May 25, 2021, now Pat. No. 11,605,584.

(30) Foreign Application Priority Data

Sep. 9, 2020   (KR) .................. 10-2020-0115321

(51) Int. Cl.
*H01L 23/48*      (2006.01)
*H01L 21/48*      (2006.01)
(Continued)

(52) U.S. Cl.
CPC .... *H01L 23/49838* (2013.01); *H01L 21/4857* (2013.01); *H01L 23/49816* (2013.01);
(Continued)

(58) Field of Classification Search
CPC .......... H01L 23/49838; H01L 21/4857; H01L 23/49816; H01L 23/49822; H01L 23/5383; H01L 23/5386; H01L 24/08
See application file for complete search history.

(56) References Cited

U.S. PATENT DOCUMENTS

| 6,734,568 B2 * | 5/2004 | Matsuo | H01L 25/0657 257/E21.705 |
| 6,884,650 B2 * | 4/2005 | Lee | H01L 24/81 257/E21.511 |

(Continued)

*Primary Examiner* — Nicholas J Tobergte
(74) *Attorney, Agent, or Firm* — F. CHAU & ASSOCIATES, LLC

(57) ABSTRACT

A semiconductor package includes a redistribution substrate and a semiconductor chip thereon. The redistribution substrate includes a ground under-bump pattern, signal under-bump patterns laterally spaced apart from the ground under-bump pattern, first signal line patterns disposed on the signal under-bump patterns and coupled to corresponding signal under-bump patterns, and a first ground pattern coupled to the ground under-bump pattern and laterally spaced apart from the first signal line pattern. Each of the signal and ground under-bump patterns includes a first part and a second part formed on the first part and that is wider than the first part. The second part of the ground under-bump pattern is wider than the second part of the signal under-bump pattern. The ground under-bump pattern vertically overlaps the first signal line patterns. The first ground pattern does not vertically overlap the signal under-bump patterns.

20 Claims, 21 Drawing Sheets

(51) Int. Cl.
  *H01L 23/498* (2006.01)
  *H01L 23/538* (2006.01)
  *H01L 25/10* (2006.01)
  *H01L 23/00* (2006.01)
  *H01L 25/065* (2023.01)
  *H01L 25/18* (2023.01)

(52) U.S. Cl.
  CPC .... *H01L 23/49822* (2013.01); *H01L 23/5383* (2013.01); *H01L 23/5386* (2013.01); *H01L 25/105* (2013.01); *H01L 24/08* (2013.01); *H01L 24/16* (2013.01); *H01L 24/17* (2013.01); *H01L 24/33* (2013.01); *H01L 24/73* (2013.01); *H01L 25/0652* (2013.01); *H01L 25/18* (2013.01); *H01L 2224/08225* (2013.01); *H01L 2224/16227* (2013.01); *H01L 2224/17181* (2013.01); *H01L 2224/33181* (2013.01); *H01L 2224/73204* (2013.01); *H01L 2224/73253* (2013.01); *H01L 2225/1035* (2013.01); *H01L 2225/1058* (2013.01); *H01L 2924/1431* (2013.01); *H01L 2924/1433* (2013.01); *H01L 2924/14361* (2013.01)

(56) References Cited

U.S. PATENT DOCUMENTS

| | | | | |
|---|---|---|---|---|
| 7,682,960 | B2* | 3/2010 | Wen | H01L 24/05 |
| | | | | 257/E21.508 |
| 8,193,639 | B2 | 6/2012 | Liu et al. | |
| 8,786,081 | B2 | 7/2014 | Chen | |
| 8,790,504 | B2 | 7/2014 | Kodani | |
| 9,842,825 | B2 | 12/2017 | Huang et al. | |
| 10,276,516 | B2* | 4/2019 | Lin | H01L 23/562 |
| 10,290,604 | B2* | 5/2019 | Huang | H01L 21/6835 |
| 10,374,142 | B2* | 8/2019 | Ajima | H03H 3/08 |
| 10,398,027 | B2 | 8/2019 | Oshima et al. | |
| 11,948,872 | B2* | 4/2024 | Kim | H01L 25/18 |
| 2008/0157341 | A1* | 7/2008 | Yang | H01L 23/467 |
| | | | | 257/E21.507 |
| 2009/0091028 | A1* | 4/2009 | Lin | H01L 24/05 |
| | | | | 257/737 |
| 2009/0309212 | A1* | 12/2009 | Shim | H01L 21/6835 |
| | | | | 257/E23.012 |
| 2011/0127668 | A1* | 6/2011 | Lin | H01L 23/3121 |
| | | | | 257/737 |
| 2011/0175235 | A1 | 7/2011 | Horiuchi et al. | |
| 2013/0161833 | A1* | 6/2013 | Pendse | H01L 23/5389 |
| | | | | 257/777 |
| 2013/0207107 | A1 | 8/2013 | Kuo | |
| 2014/0061888 | A1* | 3/2014 | Lin | H01L 21/565 |
| | | | | 438/118 |
| 2015/0187608 | A1* | 7/2015 | Ganesan | H01L 23/49811 |
| | | | | 438/118 |
| 2015/0364445 | A1 | 12/2015 | Choi et al. | |
| 2016/0056126 | A1* | 2/2016 | Yu | H01L 24/14 |
| | | | | 257/737 |
| 2016/0172329 | A1* | 6/2016 | Chang | H01L 23/293 |
| | | | | 257/737 |
| 2016/0260684 | A1* | 9/2016 | Zhai | H01L 25/0652 |
| 2016/0260695 | A1* | 9/2016 | Chung | H01L 23/34 |
| 2019/0043817 | A1 | 2/2019 | Kadade et al. | |
| 2019/0103372 | A1 | 4/2019 | Chen et al. | |
| 2019/0122994 | A1 | 4/2019 | Lee et al. | |
| 2020/0051936 | A1 | 2/2020 | Huang et al. | |
| 2020/0083201 | A1* | 3/2020 | Suk | H01L 24/09 |
| 2020/0176391 | A1 | 6/2020 | Lim et al. | |
| 2021/0111114 | A1* | 4/2021 | Lee | H01L 23/49838 |
| 2021/0202391 | A1 | 7/2021 | Chun et al. | |
| 2022/0077048 | A1 | 3/2022 | Suk et al. | |

* cited by examiner

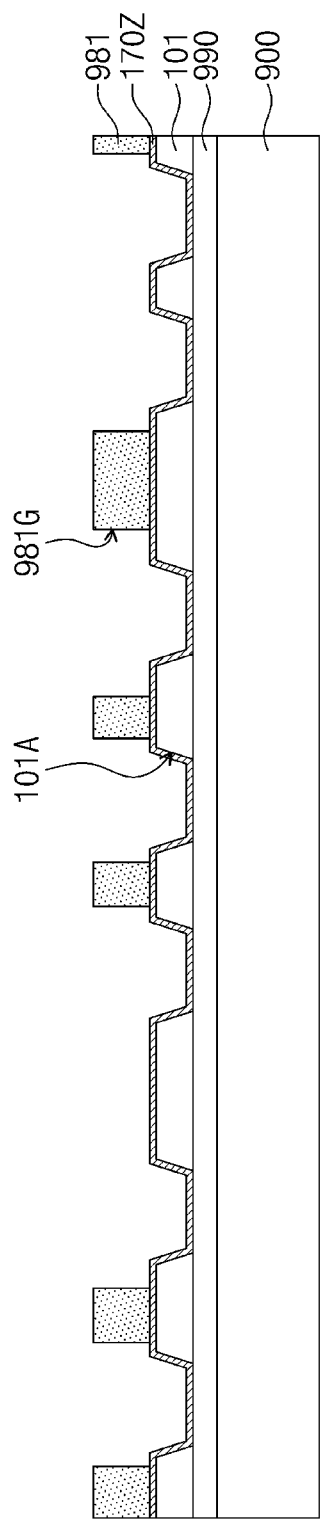
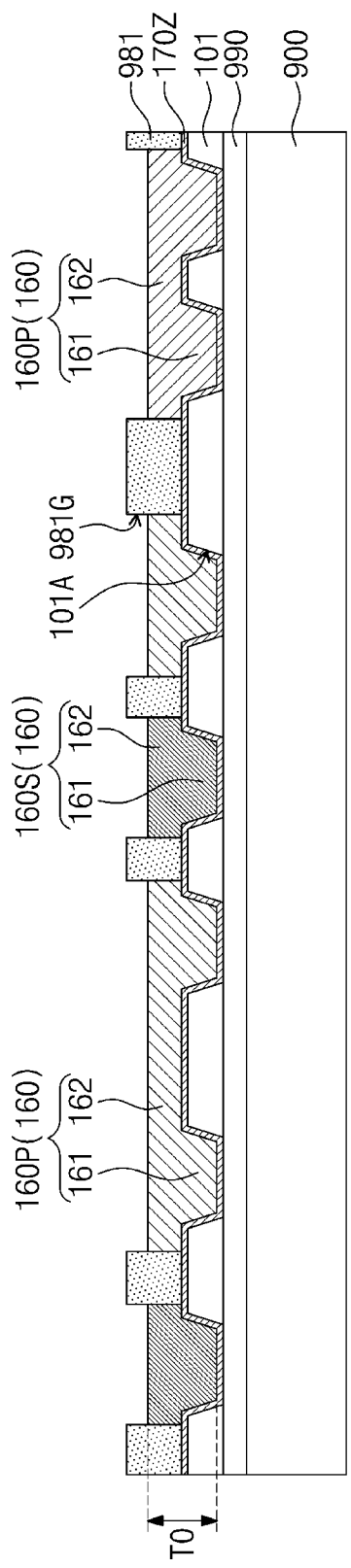
FIG. 2A
FIG. 2B

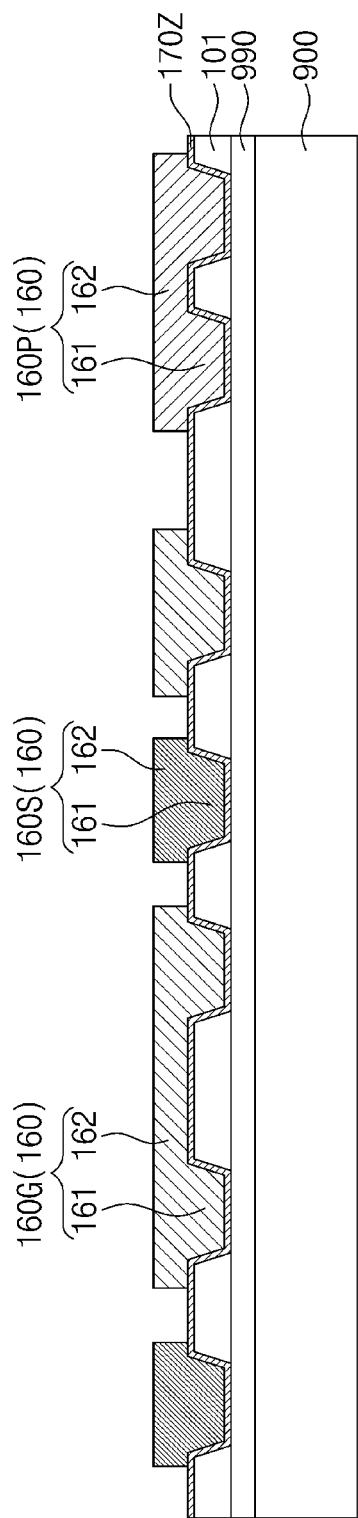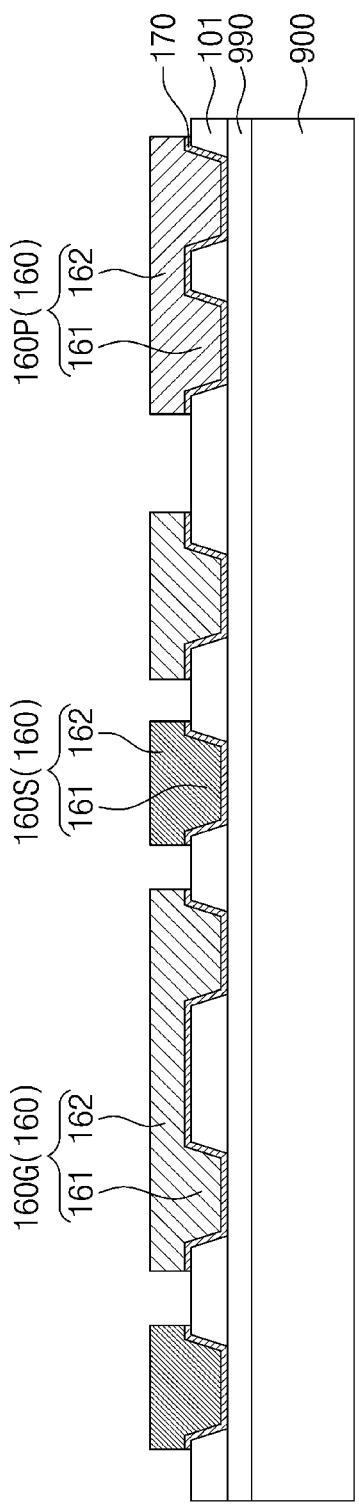

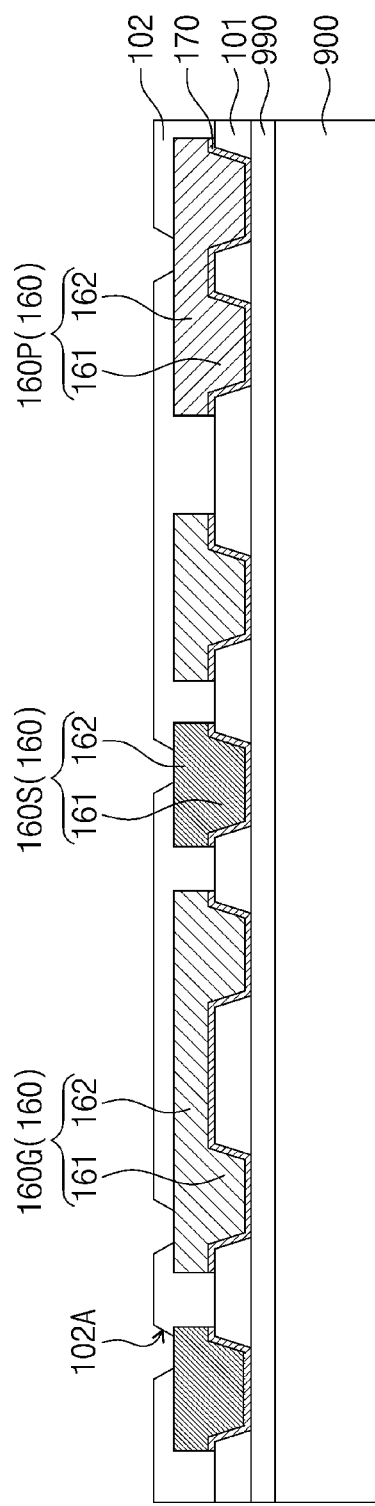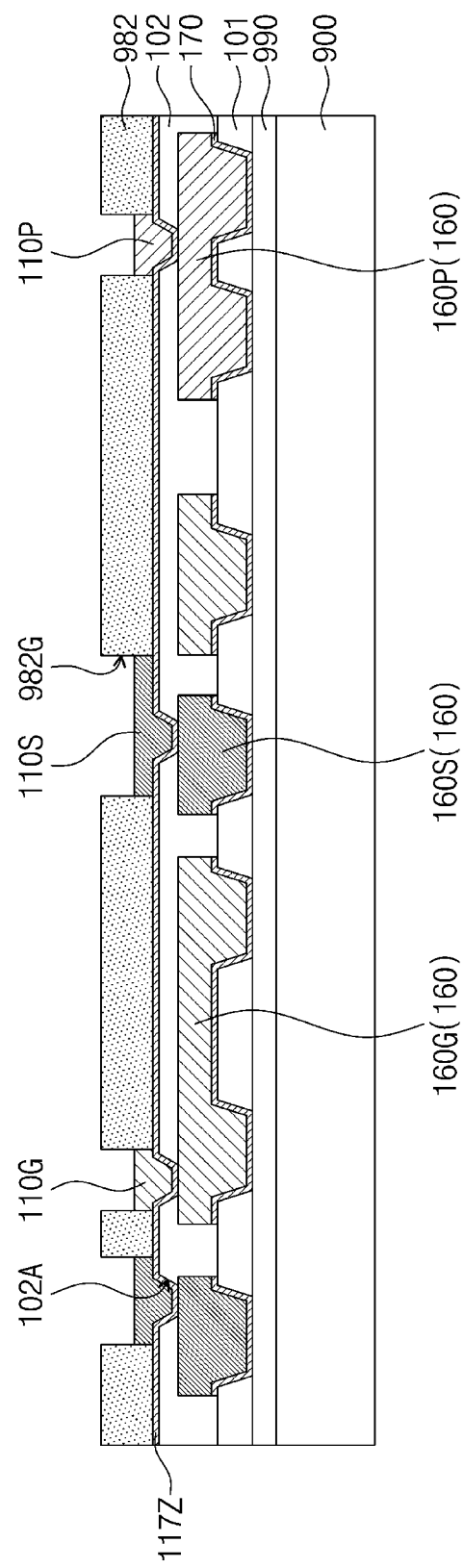

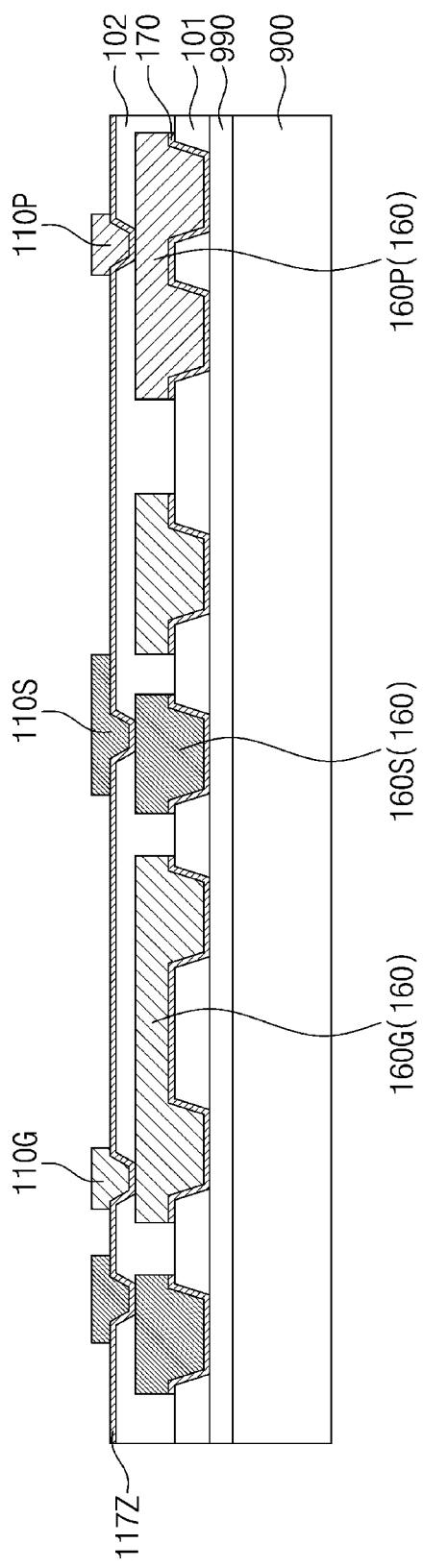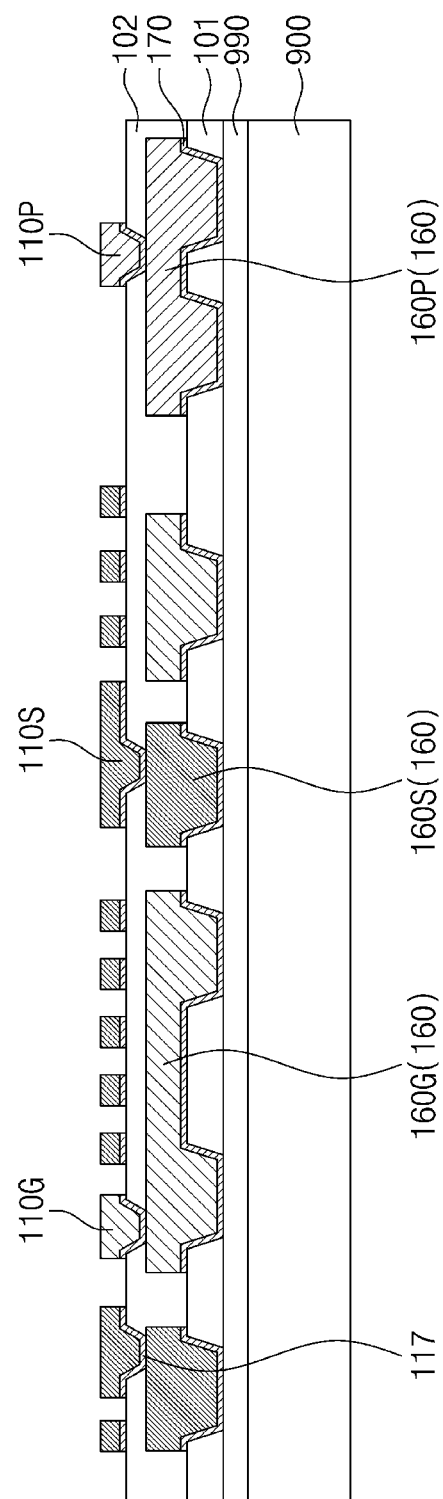

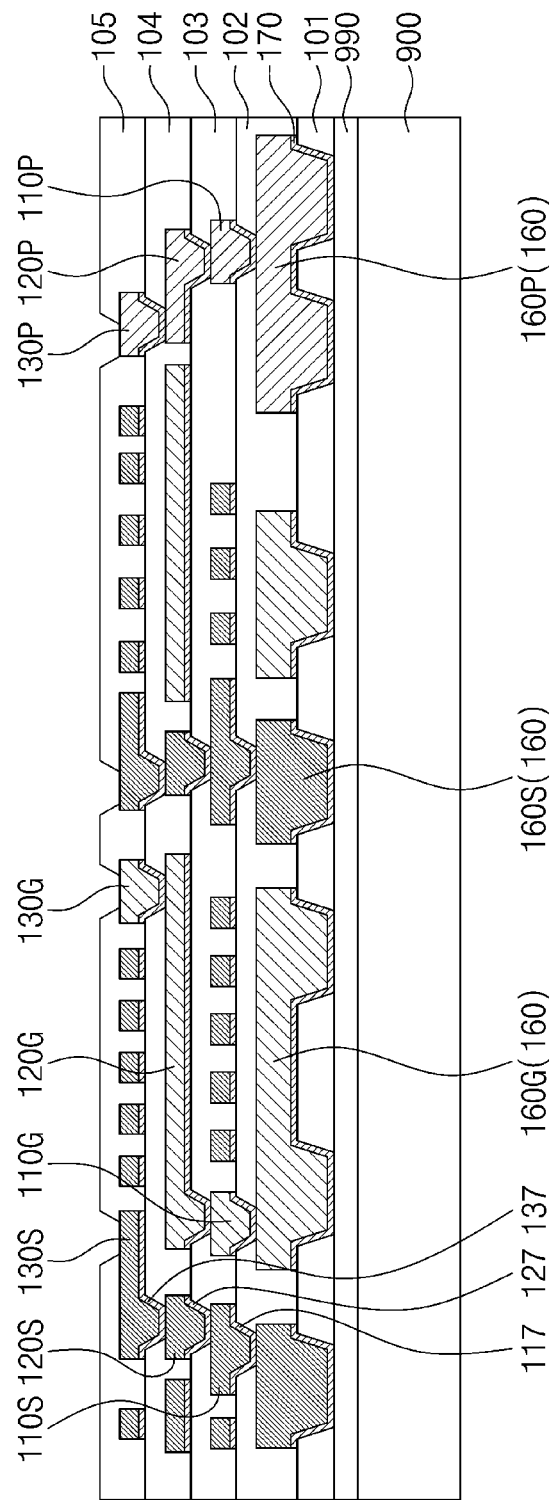

SEMICONDUCTOR PACKAGE

CROSS-REFERENCE TO RELATED APPLICATION

This U.S. nonprovisional application is a continuation of U.S. patent application Ser. No. 17/329,256, filed on May 25, 2021 in the U.S. Patent and Trademark Office, which claims priority under 35 U.S.C § 119 from Korean Patent Application No. 10-2020-0115321, filed on Sep. 9, 2020 in the Korean Intellectual Property Office, the contents of both of which are herein incorporated by reference in their entireties.

TECHNICAL FIELD

Embodiments of the present inventive concepts are directed to a semiconductor package, and more particularly, to a semiconductor package that includes a redistribution substrate and a method of fabricating the same.

DISCUSSION OF THE RELATED ART

A semiconductor package implements an integrated circuit chip for use in electronic products. Typically, a semiconductor package is configured such that a semiconductor chip is mounted on a printed circuit board (PCB) and bonding wires or bumps are used to electrically connect the semiconductor chip to the printed circuit board.

SUMMARY

Some embodiments of the present inventive concepts provide a semiconductor package with increased reliability and a method of fabricating the same.

According to some embodiments of the present inventive concepts, a semiconductor package includes: a redistribution substrate; and a semiconductor chip disposed on the redistribution substrate. The redistribution substrate includes: a ground under-bump pattern; a plurality of signal under-bump patterns that are laterally spaced apart from the ground under-bump pattern; a plurality of first signal line patterns disposed on the plurality of signal under-bump patterns and coupled to corresponding patterns of the plurality of signal under-bump patterns; and a first ground pattern coupled to the ground under-bump pattern and that is laterally spaced apart from the first signal line pattern. Each of the signal and ground under-bump patterns includes: a first part; and a second part formed on the first part and that is wider than the first part. The second part of the ground under-bump pattern is wider than the second part of the signal under-bump pattern. The ground under-bump pattern vertically overlaps the plurality of first signal line patterns. The first ground pattern does not vertically overlap the plurality of signal under-bump patterns.

According to some embodiments of the present inventive concepts, a semiconductor package includes: a redistribution substrate that includes a first surface and a second surface that face each other; a semiconductor chip disposed on the first surface of the redistribution substrate; and a plurality of ground solder patterns disposed on the second surface of the redistribution substrate. The redistribution substrate includes: an under-bump pattern that includes a plurality of ground under-bump patterns and a plurality of signal under-bump patterns that are laterally spaced apart from the ground under-bump pattern; a first conductive pattern disposed on a top surface of the under-bump pattern and that is electrically connected to the under-bump pattern; and a second conductive pattern disposed on and coupled to the first conductive pattern. The ground under-bump pattern includes: a plurality of first parts connected to corresponding patterns of the plurality of ground solder patterns; and a second part that extends in a first direction parallel to a top surface of the semiconductor chip and is connected to the plurality of first parts. The first conductive pattern includes a plurality of first signal line patterns coupled to corresponding patterns of the plurality of signal under-bump patterns. The second conductive pattern includes a second ground line pattern that extends in the first direction. The plurality of first signal line patterns are disposed between a top surface of the ground under-bump pattern and a bottom surface of the second ground line pattern.

According to some embodiments of the present inventive concepts, a semiconductor package includes: a redistribution substrate that includes a first surface and a second surface that face each other; a semiconductor chip disposed on the first surface of the redistribution substrate; and a plurality of solder patterns disposed on the second surface of the redistribution substrate. The redistribution substrate includes: a ground under-bump pattern; a lower ground line pattern disposed on the ground under-bump pattern, the lower ground line pattern extending in a first direction parallel to a top surface of the semiconductor chip; an upper ground line pattern that is vertically spaced apart from the lower ground line pattern, the upper ground line pattern extending in the first direction; a ground bonding pad interposed between the upper ground line pattern and a chip pad of the semiconductor chip; a signal under-bump pattern that is laterally spaced apart from the ground under-bump pattern; a plurality of lower signal line patterns disposed between a top surface of the ground under-bump pattern and a bottom surface of the lower ground line pattern; and a plurality of upper signal line patterns disposed between a top surface of the lower ground line pattern and a bottom surface of the upper ground line pattern. Each of the ground and signal under-bump patterns includes: a first part coupled to one of the plurality of solder patterns; and a second part connected to the first part and that is wider than the first part. A cross-sectional area of the second part of the ground under-bump pattern is greater than a cross-sectional area of the second part of the signal under-bump pattern.

According to some embodiments of the present inventive concepts, a method of fabricating a semiconductor package includes: preparing a carrier substrate; forming a first dielectric layer, an under-bump seed layer, and a first resist pattern on the carrier substrate, wherein forming the first dielectric layer includes coating a photosensitive polymer wherein first openings are formed in the first dielectric layer; forming first guide openings in the first resist pattern that expose the under-bump seed layer; forming under-bump patterns in the first openings and the first guide openings and that cover the under-bump seed layer, by performing an electroplating process in which the under-bump seed layer is used as an electrode, wherein the electroplating process terminates before the under-bump patterns extend onto a top surface of the first resist pattern; and removing the first resist pattern and exposing a top surface of a first part of the under-bump seed layer and sidewalls of second parts of the under-bump patterns; patterning the under-bump seed layer wherein a plurality of under-bump seed patterns are formed.

DETAILED DESCRIPTION

Figure 1A:
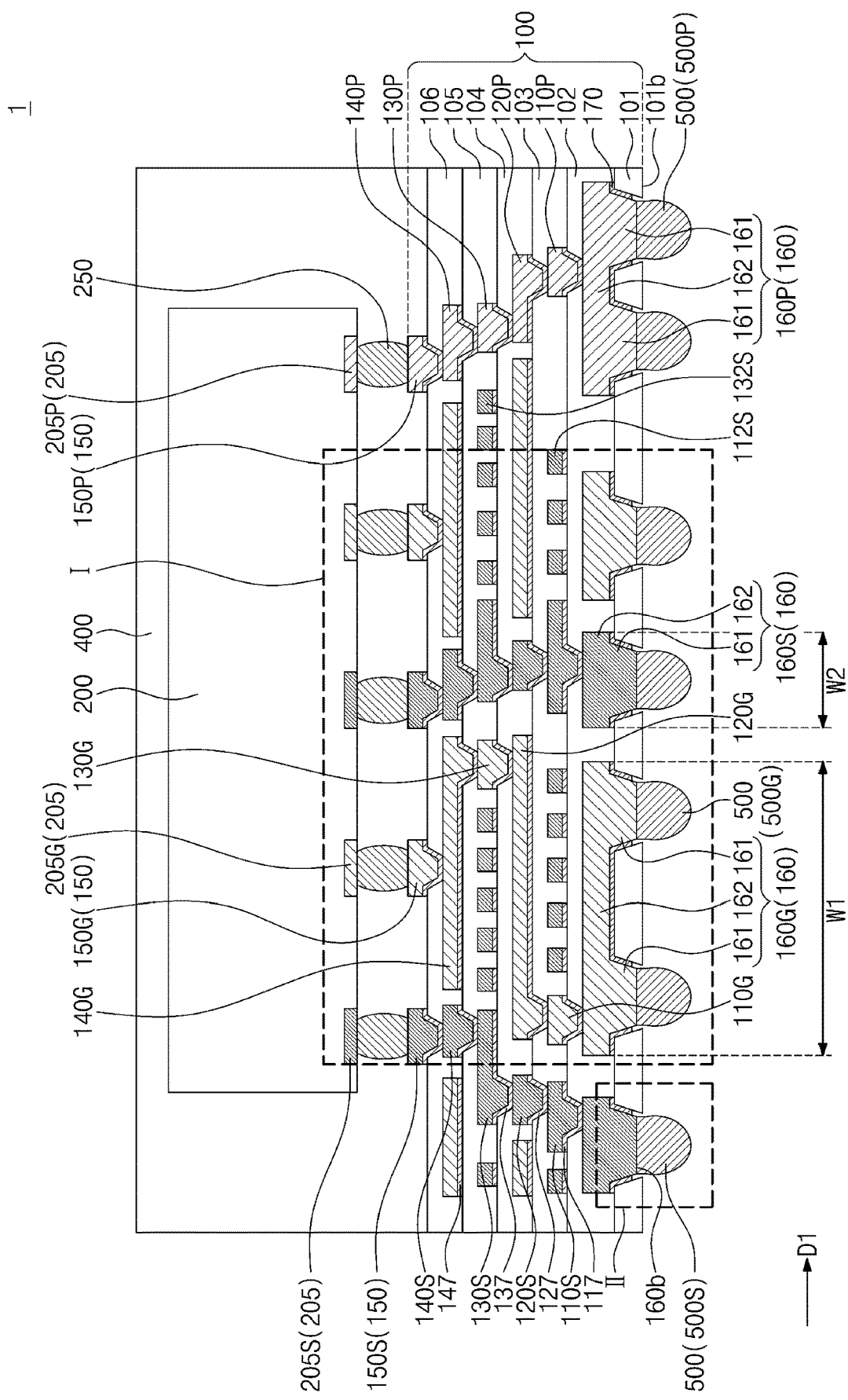
FIG. 1A is a cross-sectional view of a semiconductor package according to some embodiments.

In this description, like reference numerals may indicate like components.

"About" or "approximately" as used herein is inclusive of the stated value and means within an acceptable range of deviation for the particular value as determined by one of ordinary skill in the art, considering the measurement in question and the error associated with measurement of the particular quantity, i.e., the limitations of the measurement system.

Figure 1B:
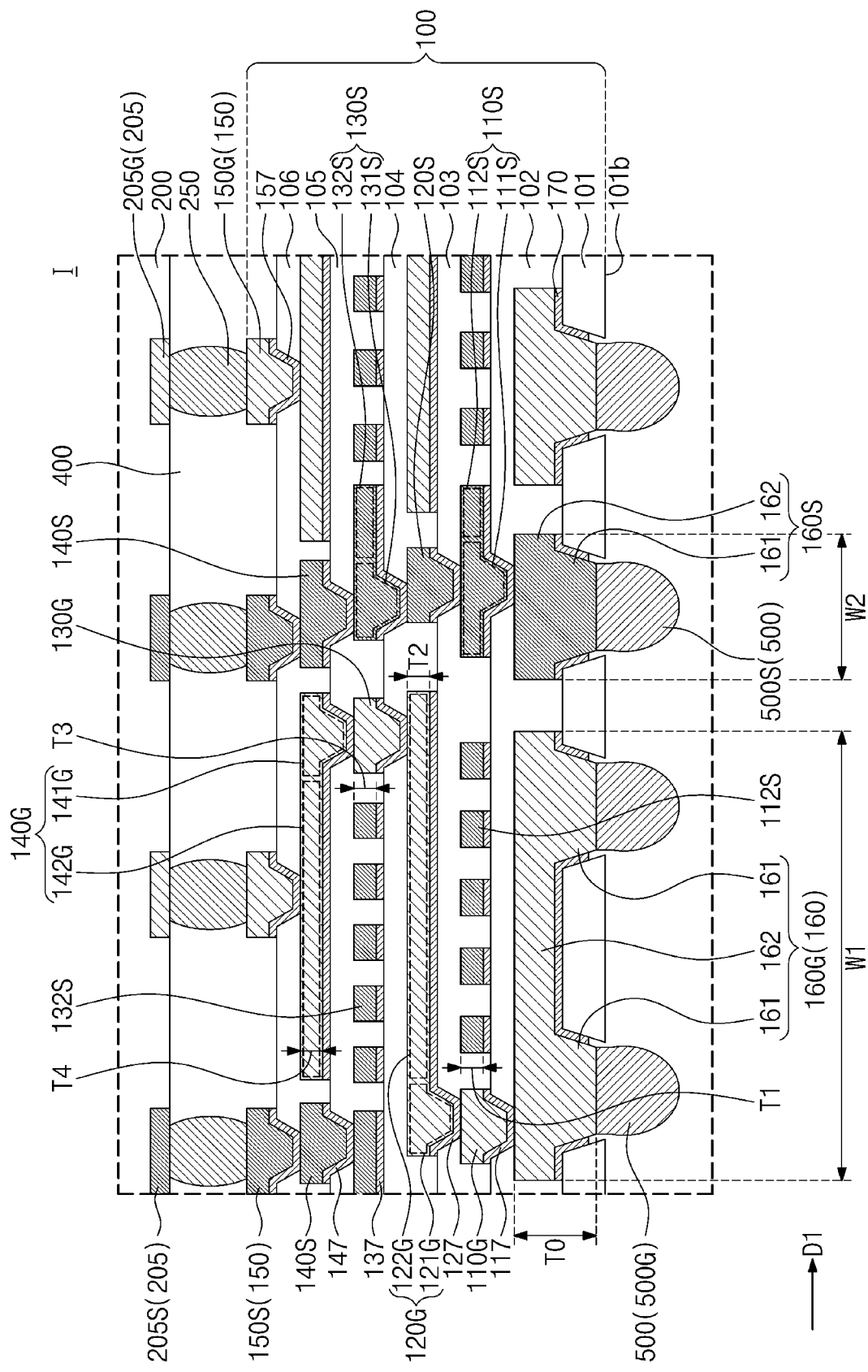
FIG. 1B is an enlarged view showing section I of FIG. 1A.
Figure 1C:
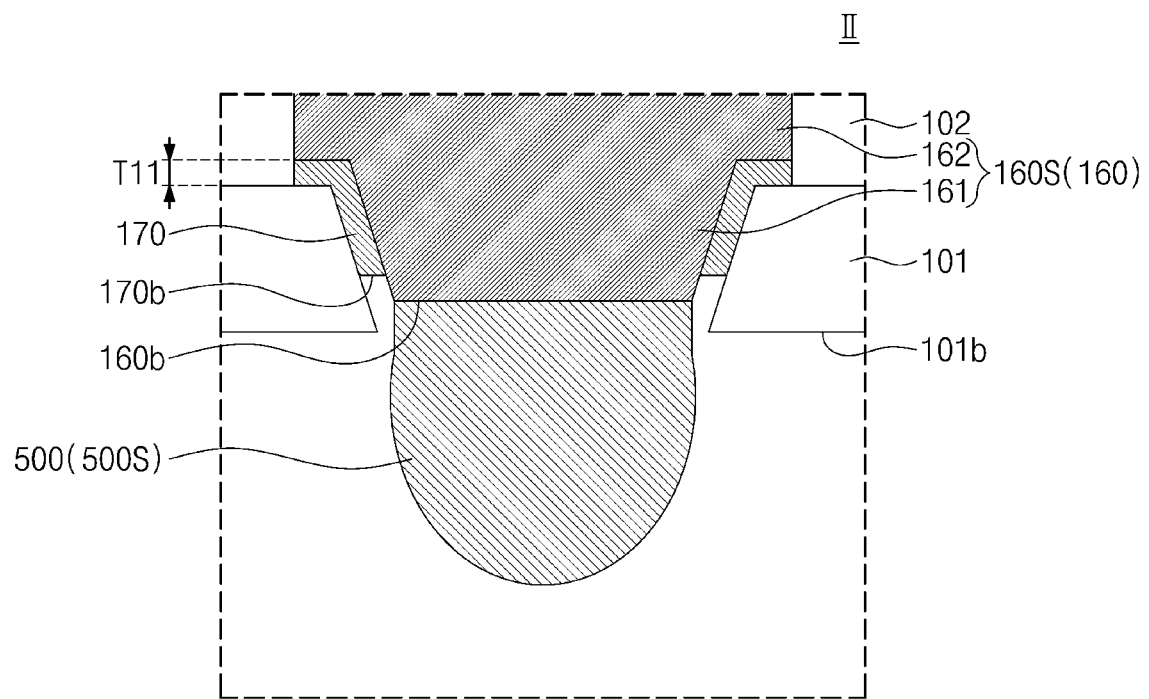
FIG. 1C is an enlarged view of section II of FIG. 1A.
Figure 1D:
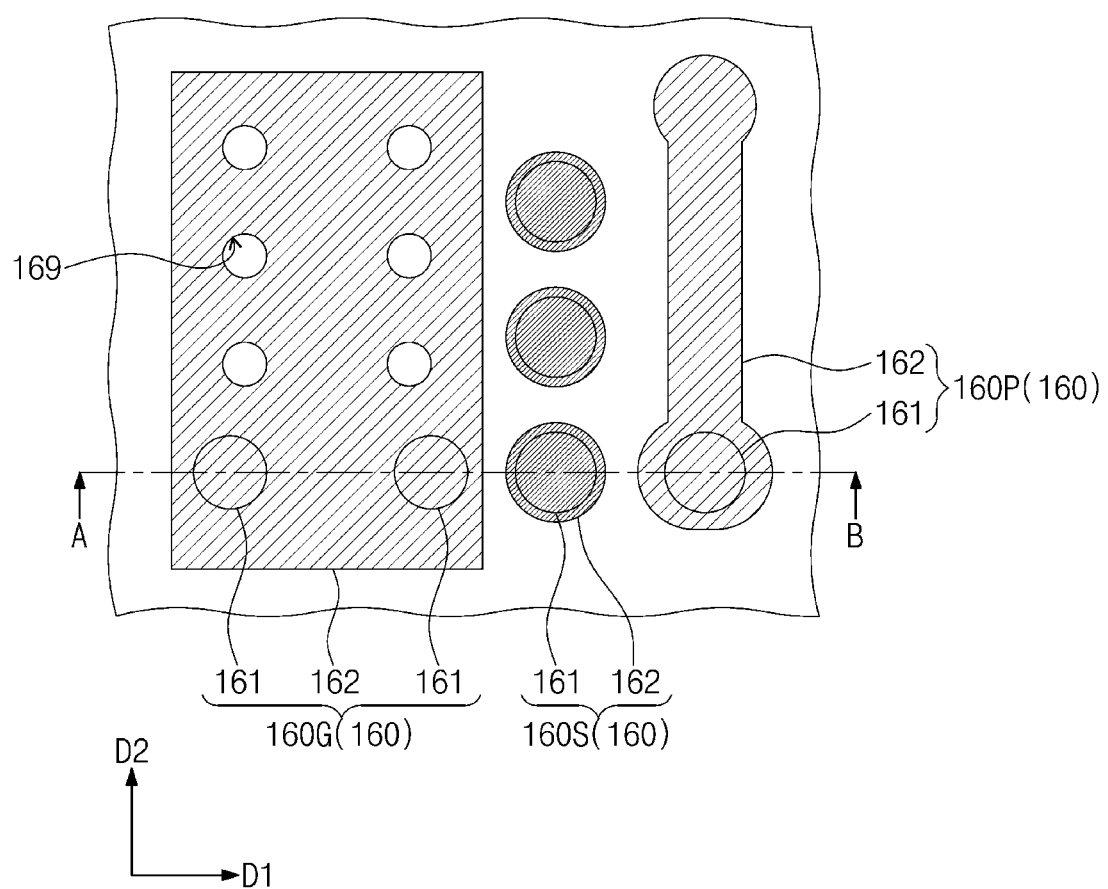
FIG. 1D is a plan view of an under-bump pattern according to some embodiments.
Figure 1E:
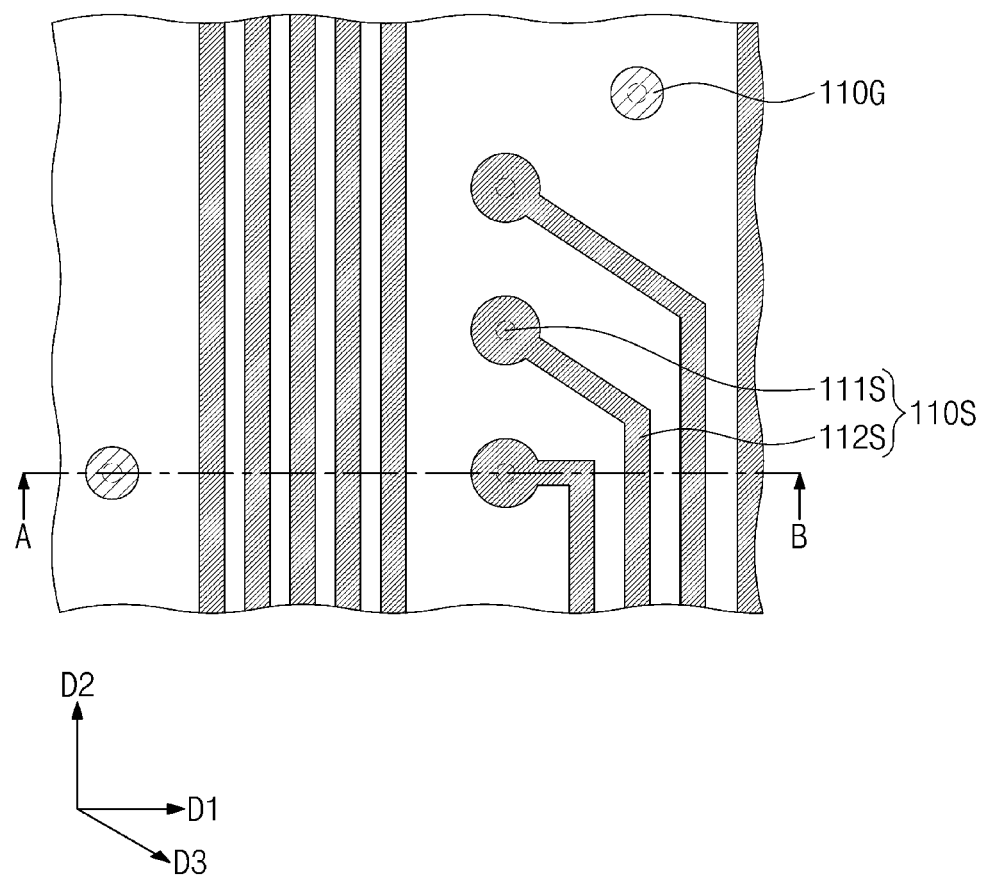
FIG. 1E is a plan view of first conductive patterns according to some embodiments.
Figure 1F:
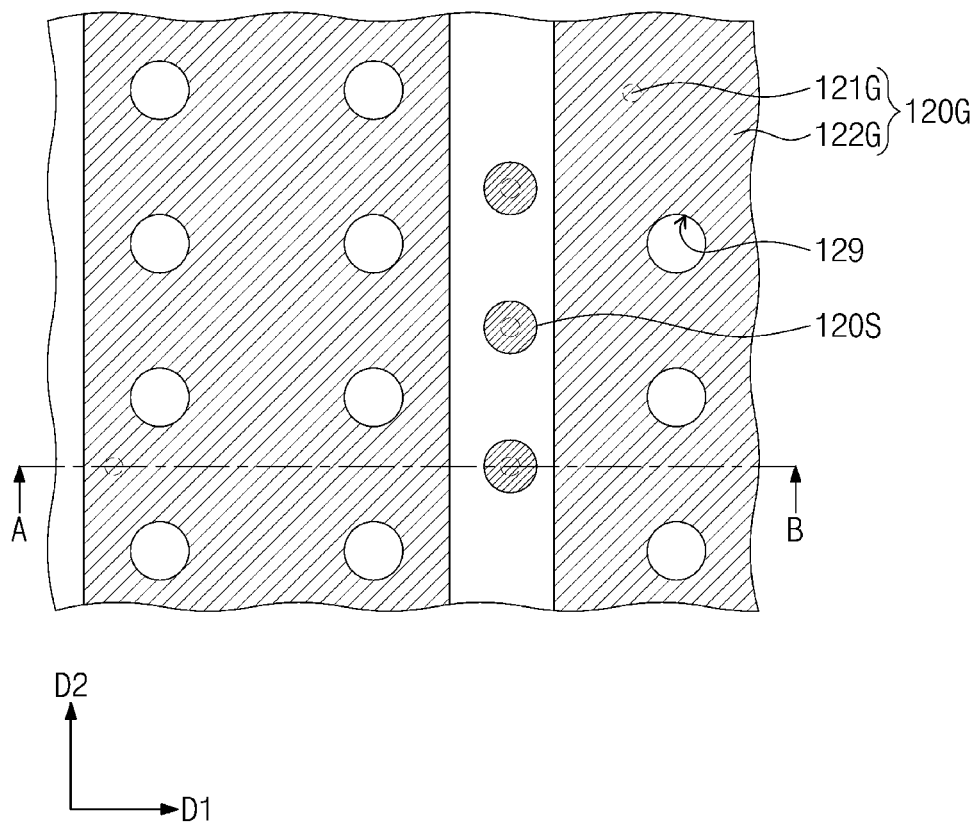
FIG. 1F is a plan view of second conductive patterns according to some embodiments.

FIG. 1A is a cross-sectional view of a semiconductor package according to some embodiments. FIG. 1B is an enlarged view of section I of FIG. 1A. FIG. 1C is an enlarged view of section II of FIG. 1A. FIG. 1D is a plan view of an under-bump pattern according to some embodiments. FIG. 1E is a plan view of first conductive patterns according to some embodiments. FIG. 1F is a plan view of second conductive patterns according to some embodiments. FIG. 1B corresponds to a cross-section taken along line A-B of FIG. 1D, 1E, or 1F.

Referring to FIGS. 1A, 1B, 1C, 1D, and 1E, according to some embodiments, a semiconductor package 1 includes a redistribution substrate 100, a semiconductor chip 200, and solder patterns 500. The redistribution substrate 100 has a first surface and a second surface that face each other. The first surface may be a top surface of the redistribution substrate 100, and the second surface may be a bottom surface of the redistribution substrate 100.

According to some embodiments, the solder patterns 500 are disposed on the second surface of the redistribution substrate 100. The solder patterns 500 serve as terminals of the semiconductor package 1. The solder patterns 500 may include a solder ball, a bump, a pillar, or any combination thereof. The solder patterns 500 include a solder material. In this description, the solder materials include tin, bismuth, lead, silver, or any alloy thereof. The solder patterns 500 include a ground solder pattern 500G, a signal solder pattern 500S, and a power solder pattern 500P. The ground solder pattern 500G, the signal solder pattern 500S, and the power solder pattern 500P are laterally spaced apart and electrically separated from each other. A voltage applied to the power solder pattern 500P differs from that applied to the ground solder pattern 500G. The signal solder pattern 500S serves as a pathway through which a data signal is input to or output from the semiconductor chip 200.

According to some embodiments, the redistribution substrate 100 includes under-bump patterns 160, a under-bump seed pattern 170, first conductive patterns 110S, 110G, and 110P, second conductive patterns 120S, 120G, and 120P, third conductive patterns 130S, 130G, and 130P, fourth conductive patterns 140S, 140G, and 140P, bonding pads 150, and a dielectric layer. The dielectric layer may include first, second, third, fourth, fifth, and sixth dielectric layers 101, 102, 103, 104, 105, and 106.

According to some embodiments, the under-bump patterns 160 are disposed in the first dielectric layer 101. The under-bump patterns 160 include a metal, such as copper. However, under-bump patterns 160 do not include, for example, titanium. Each of the under-bump patterns 160 includes a first part 161 and a second part 162. The first part 161 of each of the under-bump patterns 160 is a solder pad. The second part 162 of each of the under-bump patterns 160 is disposed on the first part 161, and the first and second parts 161 and 162 are integrally connected to each other without a boundary therebetween. The second part 162 extends parallel to a first direction D1. The first direction D1 is parallel to a top surface of the semiconductor chip 200. Therefore, the second part 162 of the under-bump pattern 160 serves as a routing or line part. For example, the second part 162 of the under-bump pattern 160 may be a pathway that horizontally transmits an electric signal received from the solder pattern 500 connected thereto. In this description, the term "horizontally" may mean "parallel to the top surface of the semiconductor chip 200." A width of the second part 162 of the under-bump pattern 160 is greater than that of the first part 161 of the under-bump pattern 160. The width of the second part 162 of the under-bump pattern 160 corresponds to a width of a top surface of the under-bump pattern 160, and the width of the first part 161 of the under-bump pattern 160 corresponds to a width of a bottom surface 160b of the under-bump pattern 160. The bottom surface 160b of the under-bump pattern 160 faces the top surface of the under-bump pattern 160. The bottom surface 160b of the under-bump pattern 160 is a bottom surface of the first part 161. The top surface of the under-bump pattern 160 is a top surface of the second part 162. Since the second part 162 of the under-bump pattern 160 is a routing or line part, there may be a reduction in the number of stacked conductive patterns 110S, 110G, 110P, 120S, 120G, 120P, 130S, 130G, 130P, 140S, 140G, and 140P. Accordingly, the semiconductor package 1 becomes more compact.

According to some embodiments, the under-bump patterns 160 include a signal under-bump pattern 160S, a ground under-bump pattern 160G, and a power under-bump pattern 160P. The signal under-bump pattern 160S, the ground under-bump pattern 160G, and the power under-bump pattern 160P are respectively coupled to the signal solder pattern 500S, the ground solder pattern 500G, and the power solder pattern 500P. Each of the signal under-bump pattern 160S, the ground under-bump pattern 160G, and the power under-bump pattern 160P includes a first part 161 and a second part 162. The second part 162 is disposed on the first part 161, and the first and second parts 161 and 162 are integrally connected to each other without a boundary therebetween. The second part 162 of the ground under-bump pattern 160G and the second part 162 of the power under-bump pattern 160P each serve as a routing or line part.

According to some embodiments, the first parts 161 of the ground under-bump patterns 160G is in contact with corresponding ground solder patterns 500G. A plurality of ground under-bump patterns 160G are provided, and at least one of the plurality of ground under-bump patterns 160G includes a plurality of first parts 161, and another of the plurality of ground under-bump patterns 160G includes a single first part 161. The second part 162 of the at least one ground under-bump pattern 160G is disposed on and electrically connected to the plurality of first parts 161. It may thus be possible to omit a separate conductive pattern that merges the ground under-bump pattern 160G. The semiconductor package 1 may have a simplified fabrication process and a decreased thickness.

According to some embodiments, the power under-bump pattern 160P is laterally spaced apart and electrically separated from the ground under-bump pattern 160G. A plurality of power under-bump patterns 160P are provided, and at least one of the plurality of power under-bump patterns 160P includes a plurality of first parts 161. The first parts 161 of the power under-bump patterns 160P are in contact with corresponding power solder patterns 500P. The second part 162 of the at least one power under-bump pattern 160P is disposed on and electrically connected to the plurality of first parts 161. It may thus be possible to omit a separate conductive pattern that merges the power under-bump pattern 160P. The semiconductor package 1 may have a simplified fabrication process. In addition, another of the plurality of power under-bump patterns 160P includes a single first part 161.

According to some embodiments, the signal under-bump pattern 160S is laterally spaced apart and electrically separated from the ground under-bump pattern 160G and the power under-bump pattern 160P. Each of the signal under-bump patterns 160S includes a single first part 161. For example, the second part 162 of the signal under-bump pattern 160S is electrically connected to a single first part 161 and a single signal solder pattern 500S.

According to some embodiments, the second part 162 of the signal under-bump pattern 160S has a width W2 that is less than a width W1 at the second part 162 of the ground under-bump pattern 160G. The second part 162 of the signal under-bump pattern 160S has a cross-sectional area that is less than that of the second part 162 of the ground under-bump pattern 160G. The second part 162 of the ground under-bump pattern 160G serves as a routing or wiring line, but the second part 162 of the signal under-bump pattern 160S does not serve as a line part. The following will discuss a planar arrangement and shape of the under-bump pattern 160.

As shown in FIG. 1D, according to some embodiments, the signal under-bump pattern 160S have a circular shape in a plan view, but embodiments of the present inventive concepts are not limited thereto. The second part 162 of the ground under-bump pattern 160G has a planar shape and a planar area that differ from those of the second part 162 of the signal under-bump pattern 160S. For example, the ground under-bump pattern 160G has a polygonal shape, such as a tetragonal shape. For another example, the ground under-bump pattern 160G has a planar shape that includes a rectangular segment and circular segments connected to the rectangular segment. A planar area at a top surface of the ground under-bump pattern 160G is greater than a planar area at a top surface of the signal under-bump pattern 160S. The second part 162 of the ground under-bump pattern 160G has a relatively large planar area, and thus can electrically shield the first conductive patterns 110S, 110G, and 110P, which will be discussed below. Unless otherwise disclosed in this description, a planar shape and a planar area of a certain component indicates a planar shape and a planar area at a top surface of the certain component.

According to some embodiments, the ground under-bump pattern 160G has a relatively large planar area. The second part 162 of the ground under-bump pattern 160G may further have a first hole 169. The first hole 169 penetrates from the top surface to the bottom surface of the second part 162 of the ground under-bump pattern 160G. The second dielectric layer 102 directly contacts the first dielectric layer 101 through the first hole 169. Even when the ground under-bump pattern 160G has a relatively large planar area in a plan view, the presence of the first hole 169 prevents the under-bump patterns 160 from being concentrated in a specific region. Accordingly, the redistribution substrate 100 has increased reliability. Formation of the first hole 169 may be determined by how large the planar area of the ground under-bump pattern 160G is.

Referring back to FIGS. 1B and 1C, according to some embodiments, the first dielectric layer 101 is disposed on a sidewall of the under-bump pattern 160. The first dielectric layer 101 is a lowermost dielectric layer. The bottom surface 160b of the first part 161 of the under-bump pattern 160 is not covered with the first dielectric layer 101. As shown in FIG. 1C, the bottom surface 160b of the first part 161 of the under-bump pattern 160 is located at a higher level than a bottom surface 101b of the first dielectric layer 101. In this description, the term "level" refers to a vertical level, and a level difference is measured in a direction perpendicular to either the bottom surface 101b of the first dielectric layer 101 or the top surface of the semiconductor chip 200. The bottom surface 101b of the first dielectric layer 101 is parallel to the top surface of the semiconductor chip 200. The first dielectric layer 101 includes an organic material, such as a photosensitive polymer. In this description, the photosensitive polymer may be, for example, one or more of a photosensitive polyimide, polybenzoxazole, a phenolic polymer, or a benzocyclobutene polymer.

According to some embodiments, the under-bump seed pattern 170 is disposed on a sidewall of the first part 161 of the under-bump pattern 160 and on a bottom surface of the second part 162 of the under-bump pattern 160. The under-bump seed pattern 170 is interposed between the first dielectric layer 101 and the under-bump pattern 160. The under-bump seed pattern 170 increases an adhesive force between the first dielectric layer 101 and the under-bump pattern 160. Accordingly, the semiconductor package 1 has improved reliability and durability.

According to some embodiments, the under-bump seed pattern 170 is not disposed on the bottom surface 160b of the first part 161 of the under-bump pattern 160. The solder pattern 500 physically contacts the bottom surface 160b of the first part 161 of the under-bump pattern 160. A relatively large adhesive force forms between the solder pattern 500 and the under-bump pattern 160. Therefore, the solder pattern 500 can be stably attached to the under-bump pattern 160.

As shown in FIG. 1C, according to some embodiments, the portion of the under-bump seed pattern 170 disposed on the bottom surface of the second part 162 of the under-bump pattern 160 has a first thickness T11. The first thickness T11 is a thickness of the under-bump seed pattern 170 between a top surface of the first dielectric layer 101 and the bottom surface of the second part 162 of the under-bump pattern 160. The under-bump seed pattern 170 has a lowermost surface 170b disposed between the sidewall of the first part 161 of the under-bump pattern 160 and the sidewall of the first dielectric layer 101. The lowermost surface 170b of the under-bump seed pattern 170 is located at a higher level than the bottom surface 160*b* of the under-bump pattern 160. The lowermost surface 170*b* of the under-bump seed pattern 170 and the bottom surface 160*b* of the under-bump pattern 160 have a level difference therebetween that is greater than the first thickness T11 and less than 10 times the first thickness T11. The bottom surface 160*b* of the under-bump pattern 160 is located at a higher level than the bottom surface 101*b* of the first dielectric layer 101. The bottom surface 160*b* of the under-bump pattern 160 and the bottom surface 101*b* of the first dielectric layer 101 have a level difference therebetween that is substantially the same as the first thickness T11.

As shown in FIGS. 1A and 1B, according to some embodiments, the second dielectric layer 102 is disposed on the first dielectric layer 101 and covers the top surface of the first dielectric layer 101 and top surfaces and sidewalls of the second parts 162 of the under-bump patterns 160. The second dielectric layer 102 includes, for example, a photosensitive polymer. The first and second dielectric layers 101 and 102 have an indistinct boundary therebetween.

As shown in FIG. 1B, according to some embodiments, the first conductive patterns 110S, 110G, and 110P are respectively disposed on and coupled to the under-bump patterns 160S, 160G, and 160P. The first conductive patterns 110S, 110G, and 110P include a first signal pattern 110S, a first ground pattern 110G, and a first power pattern 110P. The first signal pattern 110S, the first ground pattern 110G, and the first power pattern 110P are electrically separated and laterally spaced apart from each other. Each of the first conductive patterns 110S, 110G, and 110P includes a metal, such as copper.

According to some embodiments, the first signal pattern 110S includes a first signal via part 111S and a first signal line pattern 112S. In this description, a via part of a conductive component is a portion for a vertical connection. A line pattern of a conductive component is a portion for a horizontal connection. The first signal via part 111S penetrates an upper portion of the second dielectric layer 102 and is coupled to the signal under-bump pattern 160S. The first signal line pattern 112S is disposed on a top surface of the second dielectric layer 102, and the first signal line pattern 112S and the first signal via part 111S are integrally connected to each other without a boundary therebetween. The first signal line pattern 112S includes the same material as that of the first signal via part 111S. The first signal line pattern 112S has a bottom surface at a higher level than that of a bottom surface of the first signal via part 111S. The first signal line pattern 112S extends horizontally. For example, the first signal line pattern 112S extends parallel to the first direction D1. For another example, in a plan view as shown in FIG. 1E, at least a portion of the first signal line pattern 112S has a portion parallel to a second direction D2. The second direction D2 is parallel to the bottom surface 101*b* of the first dielectric layer 101 and intersects the first direction D1. For another example, the first signal line pattern 112S further includes a part that extends in a third direction D3. The third direction D3 is parallel to the bottom surface 101*b* of the first dielectric layer 101, intersects the first and second directions D1 and D2 and extends obliquely in a plane defined by the first and second directions D1 and D2. A planar arrangement and shape of the first signal line pattern 112S is not limited to that shown in FIG. 1E, and may vary in other embodiments. The first signal line pattern 112S is a lower signal line pattern.

According to some embodiments, a plurality of the first signal pattern 110S are provided. The plurality of first signal patterns 110S include first signal line patterns 112S that are laterally spaced apart from each other. The first signal line patterns 112S have a narrow pitch and a small width. Accordingly, the semiconductor package 1 can be highly integrated. For example, each of first signal line patterns 112S has a width that is less than a width W1 of a corresponding ground under-bump pattern 160G. The corresponding ground under-bump pattern 160G vertically overlaps the first signal line patterns 112S.

According to some embodiments, when no grounded component is present on the bottom surfaces of the first signal line patterns 112S, electrical interference can occur between the first signal line patterns 112S and an external device. According to some embodiments, a plurality of first signal line patterns 112S are disposed on the top surface of the ground under-bump pattern 160G. For example, the second part 162 of the ground under-bump pattern 160G vertically overlaps the first signal line patterns 112S. Therefore, when the semiconductor package 1 operates, electrical interference can be prevented between the ground under-bump pattern 160G and an external electric device. The semiconductor package 1 has increased operating reliability.

According to some embodiments, the first ground pattern 110G includes a via part, but not a line part. The first ground pattern 110G is coupled to the ground under-bump pattern 160G. The first ground pattern 110G includes a lower portion disposed in the second dielectric layer 102. The first ground pattern 110G includes an upper portion that is laterally spaced apart from the first signal line pattern 112S. As shown in FIG. 1E, the first ground pattern 110G has a circular shape in a plan view.

According to some embodiments, the first power pattern 110P includes a via part, but not a line part. The first power pattern 110P is coupled to the power under-bump pattern 160P. The first power pattern 110P includes a lower portion disposed in the second dielectric layer 102.

According to some embodiments, a first seed pattern 117 is interposed between each of the first conductive patterns 110S, 110G, and 110P and a corresponding under-bump pattern 160 and between each of the first conductive patterns 110S, 110G, and 110P and the second dielectric layer 102. The first seed pattern 117 may include, for example, copper, titanium, or an alloy thereof.

According to some embodiments, the third dielectric layer 103 is disposed on the second dielectric layer 102 and covers the first conductive patterns 110G, 110S, and 110P. For example, the third dielectric layer 103 covers an upper sidewall and a top surface of the first ground pattern 110G, an upper sidewall and a top surface of the first power pattern 110P, an upper sidewall and a top surface of the first signal via part 111S, and a sidewall and a top surface of the first signal line pattern 112S. The third dielectric layer 103 includes, for example, a photosensitive polymer. The third dielectric layer 103 includes the same material as the second dielectric layer 102. The second and third dielectric layers 102 and 103 have an indistinct boundary therebetween. The first seed pattern 117 is not interposed between the third dielectric layer 103 and the first conductive patterns 110S, 110G, and 110P.

According to some embodiments, the second conductive patterns 120S, 120G, and 120P are respectively disposed on and coupled to the first conductive patterns 110S, 110G, and 110P. The second conductive patterns 120S, 120G, and 120P are disposed in the third dielectric layer 103 and on a top surface of the third dielectric layer 103. The second conductive patterns 120S, 120G, and 120P include a second signal pattern 120S, a second ground pattern 120G, and a second power pattern 120P. The second signal pattern 120S, the second ground pattern 120G, and the second power pattern 120P are electrically separated and laterally spaced apart from each other. Each of the second conductive patterns 120S, 120G, and 120P includes a metal, such as copper.

According to some embodiments, the second ground pattern 120G includes a second ground via part 121G and a second ground line pattern 122G. The second ground via part 121G includes a lower portion that is disposed in the third dielectric layer 103 and is coupled to the first ground pattern 110G. The second ground line pattern 122G is disposed on the top surface of the third dielectric layer 103, and the second ground line pattern 122G and an upper sidewall of the second ground via part 121G are integrally connected to each other without a boundary therebetween. The second ground line pattern 122G has a bottom surface at a higher level than a bottom surface of the second ground via part 121G. The second ground line pattern 122G extends in the first direction D1.

As shown in FIG. 1F, according to some embodiments, the second ground line pattern 122G further extends in the second direction D2. For example, the second ground line pattern 122G has a plate shape. The second ground line pattern 122G has a tetragonal shape in a plan view. When the second ground line pattern 122G has a relatively large planar area, the second ground line pattern 122G has a plurality of second holes 129. Each of the second holes 129 penetrates from a top surface to a bottom surface of the second ground line pattern 122G. In addition, the fourth dielectric layer 104 directly contacts the third dielectric layer 103 through the second holes 129. In a plan view, the second holes 129 prevent the second conductive patterns 120S, 120G, and 120P from concentrating on a specific region. Accordingly, the redistribution substrate 100 has increased reliability. A planar arrangement and shape of the second ground line pattern 122G is not limited to that shown in FIG. 1F, and may vary in other embodiments.

As shown in FIG. 1B, according to some embodiments, the second ground line pattern 122G lies on and vertically overlaps a plurality of first signal line patterns 112S. For example, a plurality of first signal line patterns 112S are interposed between the top surface of the ground under-bump pattern 160G and the bottom surface of the second ground line pattern 122G. The second ground line pattern 122G has a width greater than the widths of the corresponding first signal line patterns 112S. The corresponding first signal line patterns 112S vertically overlap the second ground line pattern 122G. The second ground line pattern 122G is a lower ground line pattern.

According to some embodiments, the second signal pattern 120S includes a via part. The second signal pattern 120S includes a lower portion disposed in the third dielectric layer 103 and is coupled to the first signal pattern 110S. The second signal pattern 120S does not include a line part. Therefore, a width at a top surface of the second signal pattern 120S is less than that at a top surface of the second ground pattern 120G. As shown in FIG. 1F, the second signal pattern 120S has a planar area that is smaller than that of the second ground pattern 120G. The planar shape of the second signal pattern 120S differs from that of the second ground pattern 120G. For example, the second signal pattern 120S has a circular shape in a plan view, but embodiments of the present inventive concepts are not limited thereto.

As shown in FIG. 1A, according to some embodiments, the second power pattern 120P includes a second power via part. The second power via part of the second power pattern 120P has a lower portion disposed in the third dielectric layer 103 and coupled to the first power pattern 110P. The second power pattern 120P further includes a second power line part.

According to some embodiments, a second seed pattern 127 is interposed between each of the second conductive patterns 120S, 120G, and 120P and a corresponding pattern of the first conductive patterns 110S, 110G, and 110P and between each of the second conductive patterns 120S, 120G, and 120P and the third dielectric layer 103. The second seed pattern 127 includes, for example, copper, titanium, or an alloy thereof.

According to some embodiments, the fourth dielectric layer 104 is disposed on the third dielectric layer 103 and covers sidewalls and top surfaces of the second conductive patterns 120S, 120G, and 120P. The fourth dielectric layer 104 includes, for example, a photosensitive polymer. The fourth dielectric layer 104 includes the same material as the third dielectric layer 103. The third and fourth dielectric layers 103 and 104 have an indistinct boundary therebetween. The second seed pattern 127 is not interposed between the fourth dielectric layer 104 and the second conductive patterns 120G, 120G, and 120P.

According to some embodiments, the third conductive patterns 130S, 130G, and 130P are respectively be disposed on and coupled to the second conductive patterns 120S, 120G, and 120P. The third conductive patterns 130S, 130G, and 130P are disposed in or on the fourth dielectric layer 104. The third conductive patterns 130S, 130G, and 130P include a third signal pattern 130S, a third ground pattern 130G, and a third power pattern 130P. The third signal pattern 130S, the third ground pattern 130G, and the third power pattern 130P are electrically separated and laterally spaced apart from each other. The third conductive patterns 130S, 130G, and 130P include a metal, such as copper.

According to some embodiments, the third signal pattern 130S includes a third signal via part 131S and a third signal line pattern 132S. The third signal via part 131S has a lower portion disposed in the fourth dielectric layer 104 and coupled to the second signal pattern 120S. The third signal line pattern 132S is disposed on a top surface of the fourth dielectric layer 104, and the third signal line pattern 132S and an upper sidewall of the third signal via part 131S are integrally connected to each other without a boundary therebetween. The third signal line pattern 132S is an upper signal line pattern. The third signal line pattern 132S has a bottom surface at a higher level than a bottom surface of the third signal via part 131S. A plurality of the third signal patterns 130S are provided. The plurality of third signal patterns 130S include third signal line patterns 132S that are laterally spaced apart from each other. The third signal line patterns 132S have a narrow pitch and a small width, and thus the semiconductor package 1 can be highly integrated. For example, each of the third signal line patterns 132S has a width less than that of a corresponding second ground line pattern 122G. The corresponding second ground line pattern 122G vertically overlaps the bottom surfaces of the third signal line patterns 132S. The third signal line pattern 132S has a planar shape similar to that of the first signal line pattern 112S described with reference to FIG. 1E.

According to some embodiments, the second ground line pattern 122G is interposed between the first signal line patterns 112S and the third signal line patterns 132S. The second ground line pattern 122G electrically shield the third signal line patterns 132S from the first signal line patterns 112S. Electrical interference can be prevented between the first signal line patterns 112S and the third signal line patterns 132S. The semiconductor package 1 has increased operating reliability.

According to some embodiments, the third ground pattern 130G includes a via part, but not a line part. The third ground pattern 130G has a lower portion disposed in the fourth dielectric layer 104 and coupled to the second ground pattern 120G. The third ground pattern 130G has a planar shape similar to that of the first ground pattern 110G described with reference to FIG. 1E.

According to some embodiments, the third power pattern 130P includes a via part, but not a line part. The third power pattern 130P has a lower portion disposed in the fourth dielectric layer 104 and coupled to the second power pattern 120P.

According to some embodiments, a third seed pattern 137 is interposed between each of the third conductive patterns 130S, 130G, and 130P and a corresponding pattern of the second conductive patterns 120S, 120G, and 120P and between each of the third conductive patterns 130S, 130G, and 130P and the third dielectric layer 103. The third seed pattern 137 includes, for example, copper, titanium, or an alloy thereof.

According to some embodiments, the fifth dielectric layer 105 is disposed on the fourth dielectric layer 104 and covers sidewalls and top surfaces of the third conductive patterns 130S, 130G, and 130P. The fifth dielectric layer 105 includes, for example, a photosensitive polymer. The fifth dielectric layer 105 includes the same material as the fourth dielectric layer 104. The fourth and fifth dielectric layers 104 and 105 have an indistinct boundary therebetween. The third seed pattern 137 is not interposed between the fifth dielectric layer 105 and the third conductive patterns 130G, 130G, and 130P.

According to some embodiments, the fourth conductive patterns 140S, 140G, and 140P are respectively disposed on and coupled to the third conductive patterns 130S, 130G, and 130P. The fourth conductive patterns 140S, 140G, and 140P are disposed in the fifth dielectric layer 105 and on a top surface of the fifth dielectric layer 105. The fourth conductive patterns 140S, 140G, and 140P include a fourth signal pattern 140S, a fourth ground pattern 140G, and a fourth power pattern 140P. The fourth signal pattern 140S, the fourth ground pattern 140G, and the fourth power pattern 140P are electrically separated and laterally spaced apart from each other. Each of the fourth conductive patterns 140S, 140G, and 140P includes a metal, such as copper.

According to some embodiments, the fourth ground pattern 140G includes a fourth ground via part 141G and a fourth ground line pattern 142G. The fourth ground via part 141G has a lower portion disposed in the fourth dielectric layer 104 and coupled to the third ground pattern 130G. The fourth ground line pattern 142G is disposed on the top surface of the fifth dielectric layer 105, and the fourth ground line pattern 142G and an upper sidewall of the fourth ground via part 141G are integrally connected to each other without a boundary therebetween. The fourth ground line pattern 142G has a bottom surface at a higher level than a bottom surface of the fourth ground via part 141G. The fourth ground line pattern 142G extends in the first direction D1. The fourth ground line pattern 142G has a planar shape similar to that of the second ground line pattern 122G described with reference to FIG. 1F.

According to some embodiments, the fourth ground line pattern 142G vertically overlaps a plurality of third signal line patterns 132S. For example, a plurality of third signal line patterns 132S are interposed between the bottom surface of the fourth ground line pattern 142G and the top surface of the second ground line pattern 122G. A width at a top surface of the fourth ground line pattern 142G is greater than a width at a top surface of each of corresponding third signal line patterns 132S. The corresponding third signal line patterns 132S vertically overlap the fourth ground line pattern 142G. The fourth ground line pattern 142G is an upper ground line pattern.

According to some embodiments, the fourth signal pattern 140S includes a via part. The fourth signal pattern 140S has a lower portion disposed in the fifth dielectric layer 105 and coupled to the third signal pattern 130S. The fourth signal pattern 140S does not include a line part. Therefore, a width at a top surface of the fourth signal pattern 140S is less than a width at a top surface of the fourth ground pattern 140G. The top surface of the fourth signal pattern 140S has a planar area that is smaller than that at the top surface of the fourth ground pattern 140G. A planar arrangement and shape of the fourth signal pattern 140S is similar to that of the second signal pattern 120S described with reference to FIG. 1F. For example, the fourth signal pattern 140S has a circular shape in a plan view.

According to some embodiments, the fourth power pattern 140P includes a fourth power via part. The fourth power via part of the fourth power pattern 140P is disposed in the fifth dielectric layer 105, and is coupled to the third power pattern 130P, but embodiments of the present inventive concepts are not limited thereto. The fourth power pattern 140P further includes a fourth power line pattern. The fourth power line pattern has a planar shape similar to that of the second ground line pattern 122G described with reference to FIG. 1F.

According to some embodiments, a fourth seed pattern 147 is interposed between each of the fourth conductive patterns 140S, 140G, and 140P and a corresponding pattern of the third conductive patterns 130S, 130G, and 130P and between each of the fourth conductive patterns 140S, 140G, and 140P and the fifth dielectric layer 105. The fourth seed pattern 147 includes, for example, copper, titanium, or an alloy thereof.

According to some embodiments, the sixth dielectric layer 106 is disposed on the fifth dielectric layer 105 and covers sidewalls and top surfaces of the fourth conductive patterns 140S, 140G, and 140P. The sixth dielectric layer 106 includes, for example, a photosensitive polymer. The sixth dielectric layer 106 includes the same material as the fifth dielectric layer 105. The fifth and sixth dielectric layers 105 and 106 have an indistinct boundary therebetween. The fourth seed pattern 147 are not interposed between the sixth dielectric layer 106 and the fourth conductive patterns 140G, 140G, and 140P.

According to some embodiments, the bonding pads 150 are disposed in the sixth dielectric layer 106 and on a top surface of the sixth dielectric layer 106. The bonding pads 150 include a signal bonding pad 150S, a ground bonding pad 150G, and a power bonding pad 150P. The signal bonding pad 150S, the ground bonding pad 150G, and the power bonding pad 150P are electrically separated and laterally spaced apart from each other. The signal bonding pad 150S, the ground bonding pad 150G, and the power bonding pad 150P are respectively disposed on and coupled to the fourth signal pattern 140S, the fourth ground pattern 140G, and the fourth power pattern 140P. The bonding pads 150 have lower portions disposed in the sixth dielectric layer 106. The bonding pads 150 have upper portions disposed on the top surface of the sixth dielectric layer 106. A width at the upper portion of each bonding pad 150 is greater than a width at the lower portion of each bonding pad 150. The bonding pads 150 include a conductive material, such as copper. Each of the bonding pads 150 furthers include a material that differs from those of the first, second, third, and fourth conductive patterns 110S, 110G, 110P, 120S, 120G, 120P, 130S, 130G, 130P, 140S, 140G, and 140P. For example, each of the bonding pads 150 includes a plurality of stacked layers, and an uppermost layer of each of the bonding pads 150 includes gold or nickel.

According to some embodiments, a pad seed pattern 157 is interposed between the sixth dielectric layer 106 and each of the bonding pads 150. Each of the pad seed patterns 157 is interposed between a corresponding pad of the bonding pads 150 and a corresponding pattern of the fourth conductive patterns 140S, 140G, and 140P. The pad seed patterns 157 are spaced apart and electrically separated from each other. The pad seed patterns 157 include, for example, copper, titanium, or an alloy thereof.

According to some embodiments, the fourth conductive patterns 140S, 140G, and 140P correspond to an uppermost line pattern. For example, the fourth conductive patterns 140S, 140G, and 140P directly contact corresponding pad seed patterns 157. The fourth conductive patterns 140S, 140G, and 140P are disposed on bottom surfaces of corresponding bonding pads 150, and are coupled to the corresponding bonding pads 150.

When upper line patterns are used as signal lines, electrical interference can occur between the signal line and an external device. According to some embodiments, the fourth conductive patterns 140S, 140G, and 140P each include the fourth ground pattern 142G, and the fourth signal pattern 140S does not include a line part. The fourth ground line pattern 142G corresponds to an uppermost ground line pattern of the redistribution substrate 100, and the third signal line patterns 132S correspond to an uppermost signal line. The fourth ground line pattern 142G are disposed on the top surfaces of the third signal line patterns 132S, and vertically overlaps the third signal line patterns 132S. Therefore, electrical interference can be prevented between the third signal line patterns 132S and an external electric device. The semiconductor package 1 has increased operating reliability.

According to some embodiments, as shown in FIG. 1B, each of the under-bump patterns 160 has a relatively large thickness T0. For example, the thickness T0 of the under-bump pattern 160 is greater than a thickness T1 of the first signal line pattern 112S, a thickness T2 of the second ground line pattern 122G, a thickness T3 of the third signal line pattern 132S, and a thickness T4 of the fourth ground line pattern 142G. The under-bump pattern 160 satisfies the above conditions, and thus the redistribution substrate 100 has increased reliability. When the thickness T0 of the under-bump pattern 160 is less than about 5 μm, the semiconductor package 1 decreases in reliability. When the thickness T0 of the under-bump pattern 160 is greater than about 20 μm, the semiconductor package 1 becomes too large. According to some embodiments, the thickness T0 of the under-bump pattern 160 ranges from about 5 μm to about 20 μm. The semiconductor package 1 has increased reliability and decreased thickness.

When the under-bump pattern 160 has the same width at upper and lower portions thereof, the thickness T0 of the under-bump pattern 160 may cause undulations in the top surface of the first dielectric layer 101. In this case, the plurality of first conductive patterns 110S, 110G, and 110P may have their top surfaces at different levels. Likewise, each of the second and third dielectric layers 102 and 103 may have undulations in the top surface thereof. In this case, the plurality of second conductive patterns 120S, 120G, and 120P may have their top surfaces at significantly different levels. The plurality of third conductive patterns 130S, 130G, and 130P may have their top surfaces at significantly different levels. The plurality of fourth conductive patterns 140S, 140G, and 140P may have their top surfaces at significantly different levels. The first, second, third, and fourth conductive patterns 110S, 110G, 110P, 120S, 120G, 120P, 130S, 130G, 130P, 140S, 140G, and 140P may have therebetween poor electrical connections caused by level differences between the top surfaces of the first conductive patterns 110S, 110G, and 110P, between the top surfaces of the second conductive patterns 120S, 120G, and 120P, between the top surfaces of the third conductive patterns 130S, 130G, and 130P, or between the top surfaces of the fourth conductive patterns 140S, 140G, and 140P. The poor electrical connection may occur between any two vertically neighboring patterns of the first, second, third, and fourth conductive patterns 110S, 110G, 110P, 120S, 120G, 120P, 130S, 130G, 130P, 140S, 140G, or 140P.

According to some embodiments, because the width of the second part 162 of the under-bump pattern 160 is greater than the width at the first part 161 of the under-bump pattern 160, it is possible to reduce or prevent undulations between the top surface of the first conductive patterns 110S, 110G, and 110P, between the top surfaces of the second conductive patterns 120S, 120G, and 120P, between the top surfaces of the third conductive patterns 130S, 130G, and 130P, or between the top surfaces of the fourth conductive patterns 140S, 140G, and 140P. Therefore, good electrical connections can be provided between the first, second, third, and fourth conductive patterns 110S, 110G, 110P, 120S, 120G, 120P, 130S, 130G, 130P, 140S, 140G, and 140P.

No limitation is imposed on the number of the stacked dielectric layers 101, 102, 103, 104, 105, and 106 and the number of the conductive patterns 110S, 110G, 110P, 120S, 120G, 120P, 130S, 130G, 130P, 140S, 140G, and 140P, and the numbers may vary in other embodiments. In addition, the redistribution substrate 100 may further include an upper passivation layer that covers the sixth dielectric layer 106 and the bonding pads 150. The redistribution substrate 100 may further include a lower passivation layer that covers the bottom surface 101b of the first dielectric layer 101.

According to some embodiments, the semiconductor chip 200 is mounted on the first surface of the redistribution substrate 100. The semiconductor chip 200 includes chip pads 205 and integrated circuits. The chip pads 205 are exposed on a bottom surface of the semiconductor chip 200. The integrated circuits are provided in the semiconductor chip 200. The integrated circuits may include a memory circuit, a logic circuit, or a combination thereof. The integrated circuits are electrically connected to the chip pads 205 through internal connection lines. The phrase "a certain component is connected to the chip pads 205" means that the certain component is coupled to the semiconductor chip 200. The phrase "a certain component is coupled to the semiconductor chip 200" means that the certain component is coupled to the integrated circuits of the semiconductor chip 200. The chip pads 205 include a signal chip pad 205S, a ground chip pad 205G, and a power chip pad 205P. The signal chip pad 205S, the ground chip pad 205G, and the power chip pad 205P are laterally spaced apart and electrically separated from each other.

According to some embodiments, bonding bumps 250 are correspondingly disposed between and electrically connected to the chip pads 205 of the semiconductor chip 200 and the bonding pads 150 of the redistribution substrate 100. The bonding bumps 250 include one or more of bump, solder, or pillar. The bonding bumps 250 include a conductive material, such as a solder material. The semiconductor chip 200 is electrically connected through the bonding bumps 250 to the redistribution substrate 100. In this description, the phrase "electrically connected to the redistribution substrate 100" means "electrically connected to one or more of the first, second, third, and fourth conductive patterns 110S, 110G, 110P, 120S, 120G, 120P, 130S, 130G, 130P, 140S, 140G, or 140P." The bonding bumps 250 have a pitch therebetween that is less than that of the solder patterns 500.

According to some embodiments, the semiconductor package 1 further includes a molding layer 400. The molding layer 400 is disposed on the redistribution substrate 100, and covers the semiconductor chip 200. The molding layer 400 covers an uppermost layer of the dielectric layers 101, 102, 103, 104, 105, and 106. The uppermost dielectric layer is the sixth dielectric layer 106. The molding layer 400 further extends toward a gap between the semiconductor chip 200 and the redistribution substrate 100, and encapsulates the bonding bumps 250. The molding layer 400 includes a dielectric polymer, such as an epoxy molding compound. In some embodiments, an under-fill layer is further interposed between the redistribution substrate 100 and the semiconductor chip 200.

Figure 1G:
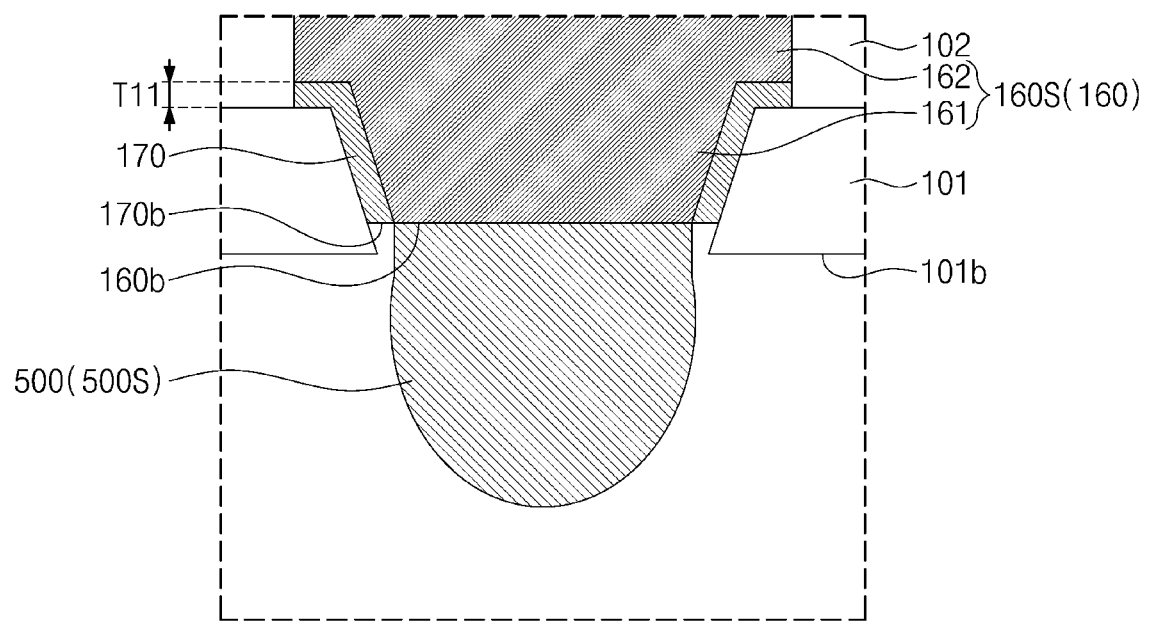
FIG. 1G is a cross-sectional view of an under-bump seed pattern and an under-bump pattern according to some embodiments.

FIG. 1G is an enlarged view of section II in FIG. 1A, showing an under-bump seed pattern and an under-bump pattern according to some embodiments.

Referring to FIG. 1G, according to some embodiments, the lowermost surface 170b of the under-bump seed pattern 170 is located at substantially the same level as the bottom surface 160b of the under-bump pattern 160. The lowermost surface 170b of the under-bump seed pattern 170 is located at a higher level than the bottom surface 101b of the first dielectric layer 101. The lowermost surface 170b of the under-bump seed pattern 170 and the bottom surface 101b of the first dielectric layer 101 have a level difference therebetween that is substantially the same as the first thickness T11.

The following will now describe methods of fabricating semiconductor packages according to some embodiments.

Figure 2I:
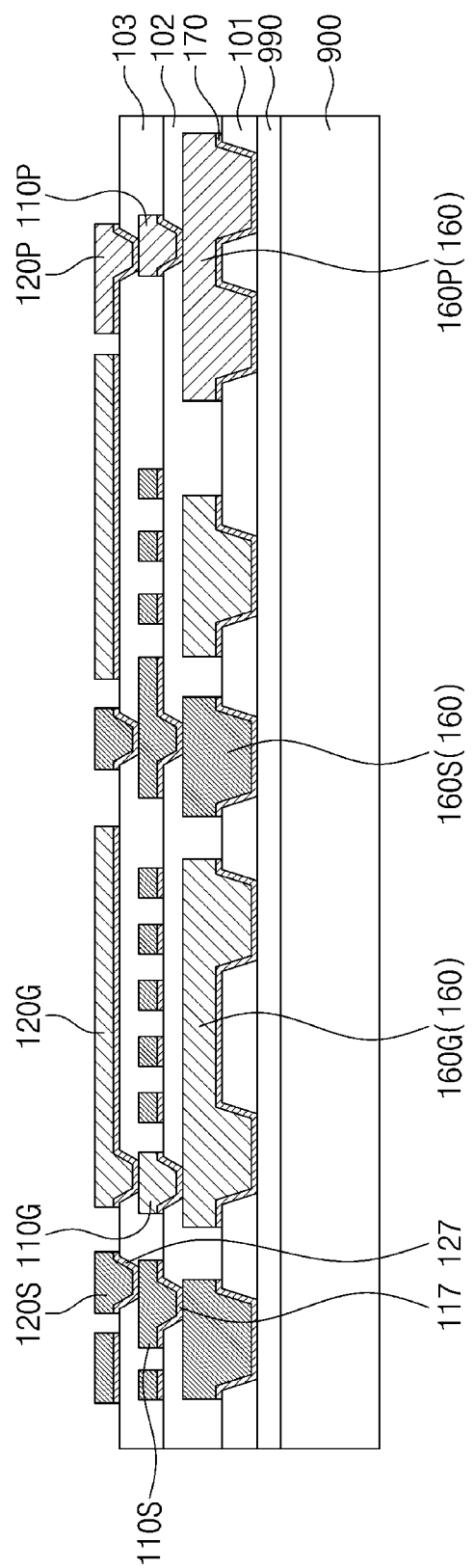
FIGS. 2A to 2N are cross-sectional views that illustrate a method of fabricating a semiconductor package according to some embodiments.
Figure 2K:
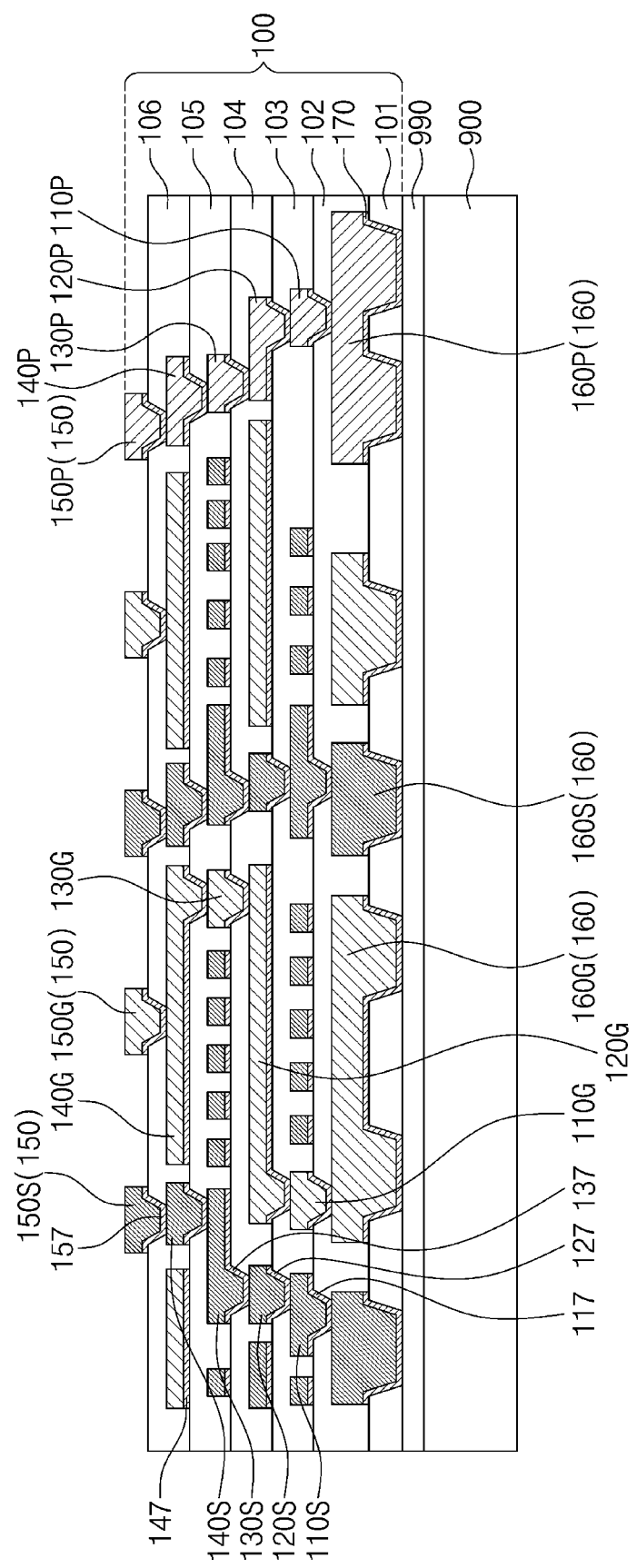
Figure 2L:
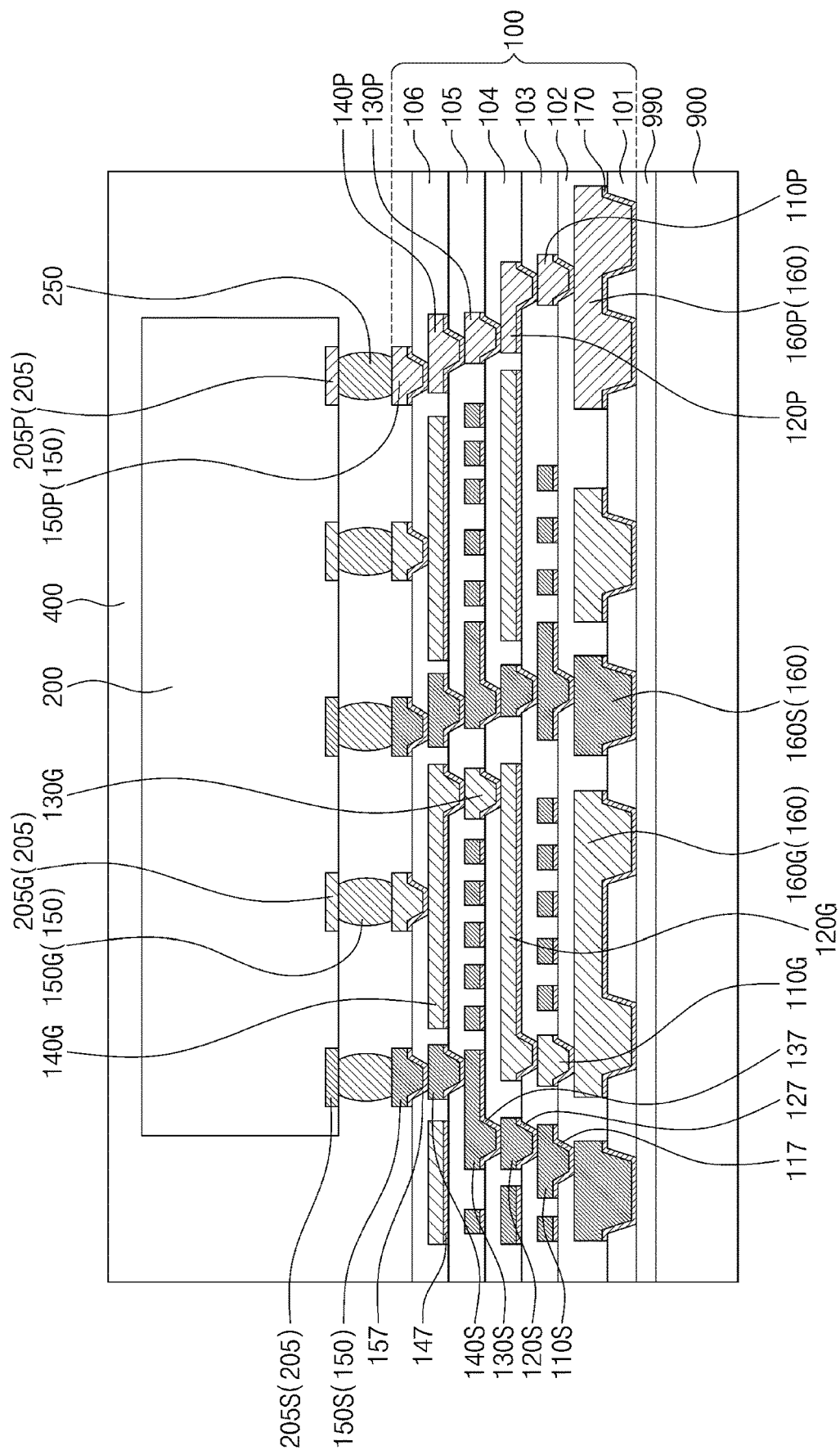
Figure 2M:
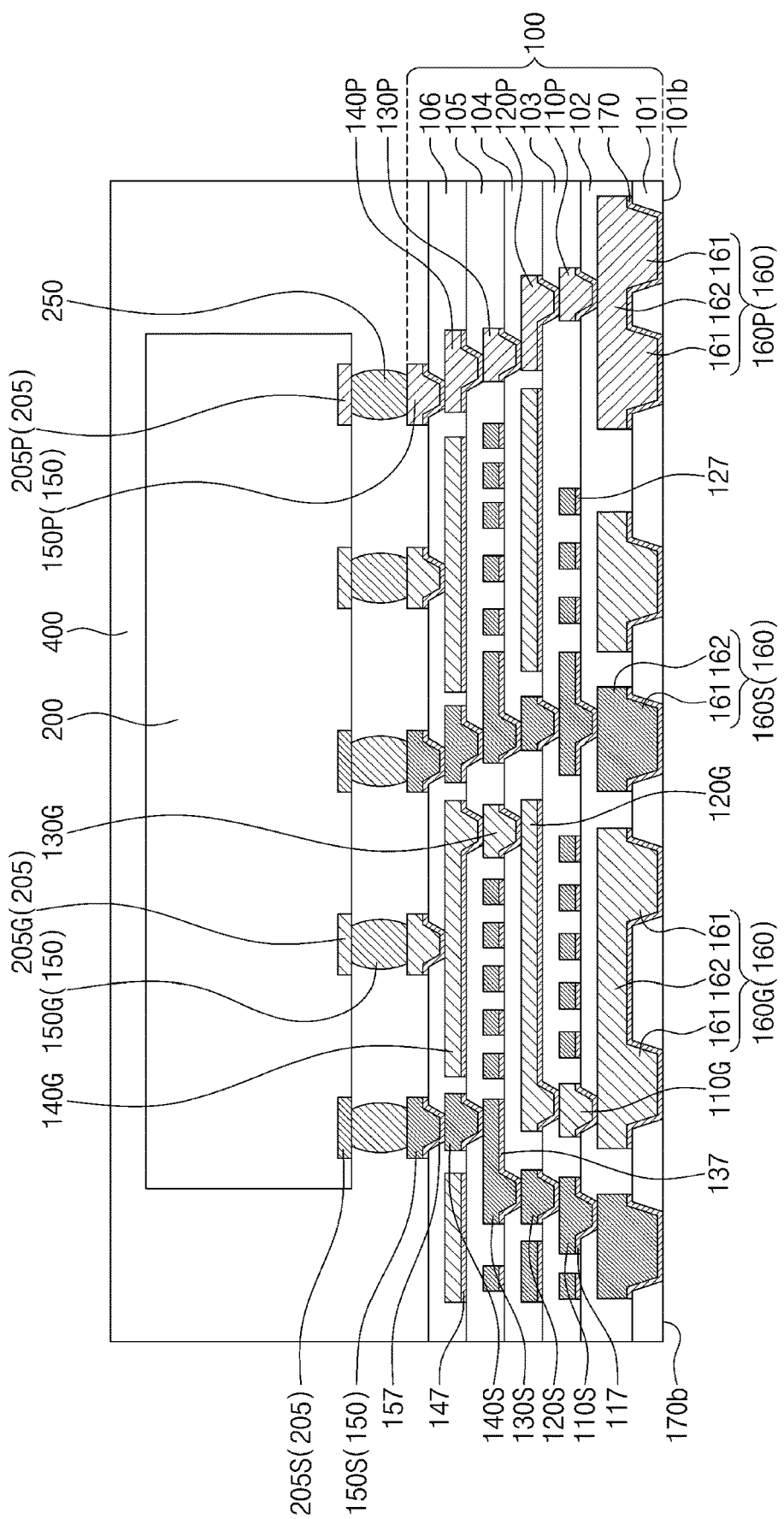
Figure 2N:
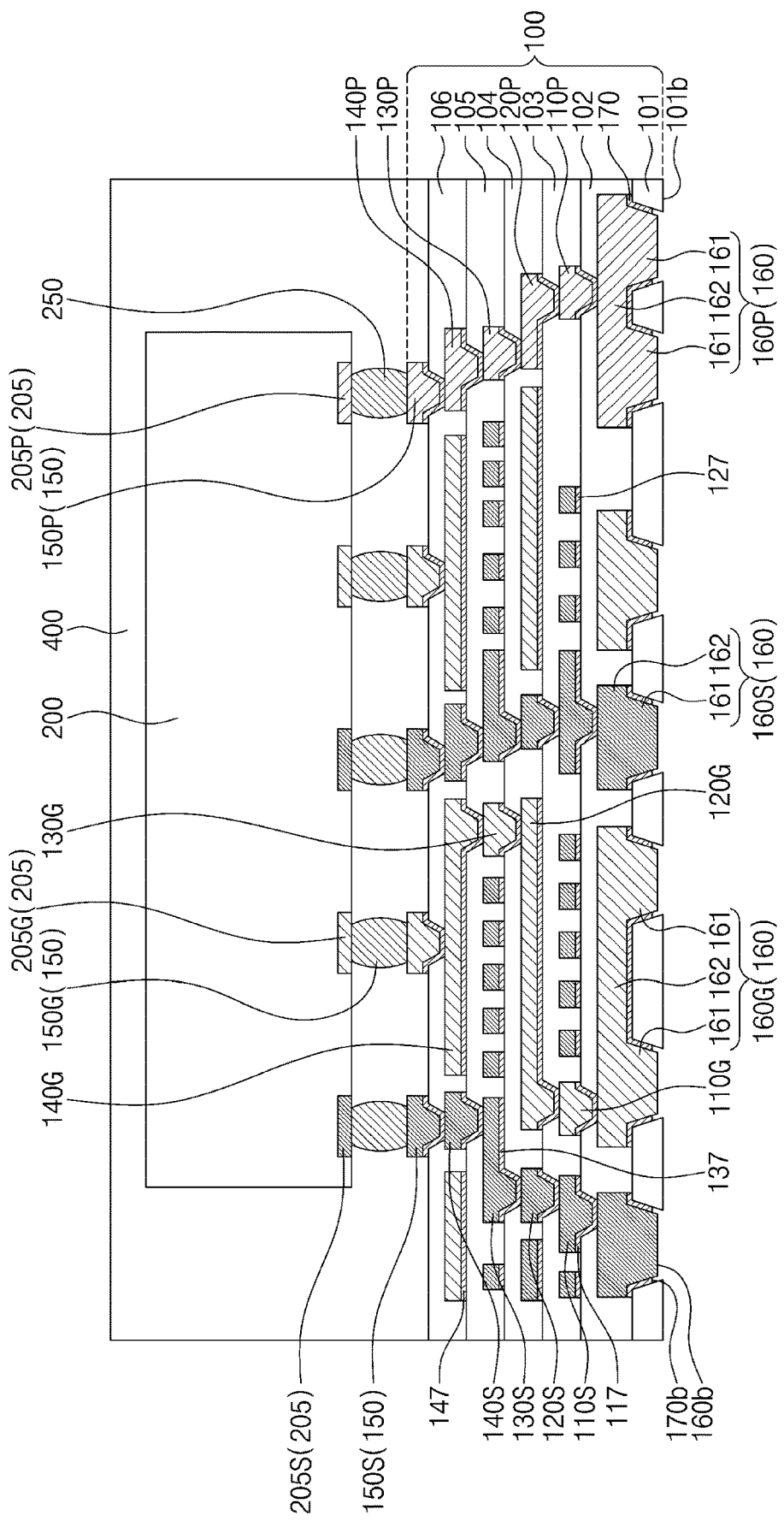

FIGS. 2A to 2N are cross-sectional views that illustrate a method of fabricating a semiconductor package according to some embodiments. A duplicate description of elements described above will be omitted below.

Referring to FIG. 2A, according to some embodiments, a carrier substrate 900 and a release layer 990 are prepared. The release layer 990 is attached to the carrier substrate 900. A first dielectric layer 101, an under-bump seed layer 170Z, and a first resist pattern 981 are formed on the carrier substrate 900. The release layer 990 is further interposed between the carrier substrate 900 and the first dielectric layer 101 and between the carrier substrate 900 and the under-bump seed layer 170Z. The first dielectric layer 101 and the under-bump seed layer 170Z are attached through the release layer 990 to the carrier substrate 900.

According to some embodiments, the forming of the first dielectric layer 101 includes coating a photosensitive polymer to form a preliminary dielectric layer, and performing an exposure process and a development process on the preliminary dielectric layer. As results of the exposure process and the development process, first openings 101A are formed in the first dielectric layer 101. The first openings 101A expose a top surface of the release layer 990 and inner walls of the first dielectric layer 101.

According to some embodiments, the under-bump seed layer 170Z is formed on the carrier substrate 900 and covers the first dielectric layer 101 and the exposed top surface of the release layer 990. For example, the under-bump seed layer 170Z conformally covers a top surface and the inner walls of the first dielectric layer 101. The under-bump seed layer 170Z can be formed by a deposition process.

According to some embodiments, the first resist pattern 981 is formed on the top surface of the first dielectric layer 101 and covers the under-bump seed layer 170Z. First guide openings 981G are formed in the first resist pattern 981 that expose the under-bump seed layer 170Z. The first guide openings 981G vertically overlap corresponding first openings 101A. The first guide openings 981G are wider than the corresponding first openings 101A.

Referring to FIG. 2B, according to some embodiments, under-bump patterns 160 are correspondingly formed in the first openings 101A and the first guide openings 981G, and cover the under-bump seed layer 170Z. The under-bump patterns 160 can be formed by performing an electroplating process in which the under-bump seed layer 170Z is used as an electrode. The electroplating process terminates before the under-bump patterns 160 extend onto a top surface of the first resist pattern 981. Therefore, no separate planarization process is required to form the under-bump patterns 160.

According to some embodiments, each of the under-bump patterns 160 includes a first part 161 and a second part 162. The first part 161 of the under-bump pattern 160 is formed in a corresponding first opening 101A, and the second part 162 of the under-bump pattern 160 is formed in a corresponding first guide opening 981G. Because the first guide opening 981G is wider than the first opening 101A, the second part 162 of the under-bump pattern 160 is wider than the first part 161 of the under-bump pattern 160.

According to some embodiments, when the under-bump pattern 160 is formed as a single layer, it may be challenging to form a thick under-bump pattern 160. According to some embodiments, the under-bump seed layer 170Z extends onto the top surface of the first dielectric layer 101, and the under-bump pattern 160 is formed on the under-bump seed layer 170Z in the first opening 101A and the first guide opening 981G. Therefore, a thick under-bump pattern 160 can be easily formed. For example, the thickness T0 of the under-bump pattern 160 ranges from about 5 μm to about 20 μm.

According to some embodiments, the under-bump patterns 160 include a signal under-bump pattern 160S, a ground under-bump pattern 160G, and a power under-bump pattern 160P. The first resist pattern 981 is used to form the under-bump patterns 160S, 160G, and 160P, and thus no separate etching process is required to laterally separate the signal under-bump pattern 160S, the ground under-bump pattern 160G, and the power under-bump pattern 160P from each other. Accordingly, the fabrication process of the semiconductor packages is simplified.

Referring to FIG. 2C, according to some embodiments, the first resist pattern 981 is removed to expose a top surface of a first part of the under-bump seed layer 170Z and sidewalls of the second parts 162 of the under-bump patterns 160. A strip process can be performed to remove the first resist pattern 981.

Referring sequentially to FIGS. 2C and 2D, according to some embodiments, the under-bump seed layer 170Z is patterned to form a plurality of under-bump seed patterns 170. The patterning of the under-bump seed layer 170Z includes performing an etching process to etch an exposed first part of the under-bump seed layer 170Z. Therefore, the first part of the under-bump seed layer 170Z is removed to expose the top surface of the first dielectric layer 101. In the etching process, the under-bump patterns 160 have an etch selectivity with respect to the under-bump seed layer 170Z. The under-bump seed layer 170Z has second parts that are correspondingly covered by the under-bump patterns 160. Therefore, the second parts of the under-bump seed layer 170Z are not removed by the etching process. After the etching process, the remaining second parts of the under-bump seed layer 170Z are the corresponding under-bump seed patterns 170. The under-bump seed patterns 170 are spaced apart and electrically separated from each other.

Referring to FIG. 2E, according to some embodiments, a second dielectric layer 102 is formed on the first dielectric layer 101 and the under-bump patterns 160, and covers top surfaces and sidewalls of the second parts 162 of the under-bump patterns 160. The second dielectric layer 102 can be formed by a coating process, such as spin coating or slit coating.

According to some embodiments, the second dielectric layer 102 is patterned to form second openings 102A in the second dielectric layer 102. The patterning of the second dielectric layer 102 can be performed by exposure and development processes. The second openings 102A expose corresponding top surfaces of the under-bump patterns 160.

Referring to FIG. 2F, according to some embodiments, a first seed layer 117Z, a second resist pattern 982, and first conductive patterns 110S, 110G, and 110P are formed on the first dielectric layer 101. The first seed layer 117Z is formed on the second dielectric layer 102 and in the second openings 102A. The first seed layer 117Z conformally covers a top surface of the second dielectric layer 102, an inner wall of the second dielectric layer 102, and the exposed top surfaces of the under-bump patterns 160.

According to some embodiments, the second resist pattern 982 is formed on the first seed layer 117Z. The forming of the second resist pattern 982 includes coating a photoresist material on the first seed layer 117Z. The second resist pattern 982 is patterned to form second guide openings 982G. The patterning of the second resist pattern 982 includes exposure and development processes. The second guide openings 982G are spatially connected to corresponding second openings 102A. The second guide openings 982G are wider than the corresponding second openings 102A. Each of the second guide openings 982G exposes the first seed layer 117Z.

According to some embodiments, the first conductive patterns 110S, 110G, and 110P are formed in corresponding second openings 102A, and cover the first seed layer 117Z. For example, the first conductive patterns 110S, 110G, and 110P fill the corresponding second openings 102A. The first conductive patterns 110S, 110G, and 110P fill lower portions of corresponding second guide openings 982G, but do not extend onto a top surface of the second resist pattern 982. The first conductive patterns 110S, 110G, and 110P are formed by an electroplating process in which the first seed layer 117Z is used as an electrode. No separate planarization process is needed to form the first conductive patterns 110S, 110G, and 110P.

According to some embodiments, the first conductive patterns 110S, 110G, and 110P include a first signal pattern 110S, a first ground pattern 110G, and a first power pattern 110P. The first signal pattern 110S, the first ground pattern 110G, and the first power pattern 110P are separated from each other. For example, the first signal pattern 110S, the first ground pattern 110G, and the first power pattern 110P are laterally spaced apart from each other. The second resist pattern 982 is used to form the first conductive patterns 110S, 110G, and 110P, and thus no additional etching process is required to laterally separate the first signal pattern 110S, the first ground pattern 110G, and the first power pattern 110P from each other. Therefore, the formation of the first conductive patterns 110S, 110G, and 110P is simplified.

According to some embodiments, as the second parts 162 of the under-bump patterns 160 are relatively wide, the second dielectric layer 102 and the first conductive patterns 110S, 110G, and 110P can be formed without undulations at their top surfaces or with reduced undulations at their top surfaces.

Referring to FIG. 2G, according to some embodiments, the second resist pattern 982 is removed to expose a top surface of a first part of the first seed layer 117Z. A strip process can remove the second resist pattern 982.

Referring to FIG. 2H, according to some embodiments, the exposed first part of the first seed layer 117Z is removed to form a first seed pattern 117. An etching process removes the first part of the first seed layer 117Z. The etching process may be a wet etching process. In the etching process, the first conductive patterns 110S, 110G, and 110P have an etch selectivity with respect to the first seed layer 117Z. The first seed layer 117Z has second parts that are covered by the first conductive patterns 110S, 110G, and 110P and are not exposed to the etching process. After the etching process terminates, the remaining second parts of the first seed layer 117Z are the plurality of first seed patterns 117. The plurality of first seed patterns 117 are separated from each other.

Referring to FIG. 2I, according to some embodiments, a third dielectric layer 103, a second seed pattern 127, and second conductive patterns 120S, 120G, and 120P are formed on the second dielectric layer 102. The third dielectric layer 103, the second seed pattern 127, and the second conductive patterns 120S, 120G, and 120P are formed by the same method used to form the second dielectric layer 102, the first seed pattern 117, and the first conductive patterns 110S, 110G, and 110P described with reference to FIGS. 2E to 2H.

For example, according to some embodiments, the third dielectric layer 103 is formed on the second dielectric layer 102, and covers the second dielectric layer 102 and the first conductive patterns 110S, 110G, and 110P. As each of the under-bump patterns 160 includes the second part 162, the third dielectric layer 103 has no undulations or reduced undulations at a top surface thereof. The third dielectric layer 103 can be formed by a coating process.

According to some embodiments, the third dielectric layer 103 is patterned to form third openings in the third dielectric layer 103. The third openings expose the top surfaces of the first conductive patterns 110S, 110G, and 110P.

According to some embodiments, the forming of the second seed pattern 127 and the second conductive patterns 120S, 120G, and 120P includes forming a second seed layer in the third openings and on the top surface of the third dielectric layer 103, forming on the second seed layer a third resist pattern that has third guide openings, performing an electroplating process in which the second seed layer is used as an electrode, removing the third resist pattern to expose a portion of the second seed layer, and then etching the exposed portion of the second seed layer.

According to some embodiments, the electroplating process forms the second conductive patterns 120S, 120G, and 120P in the third openings and the third guide openings. The second conductive patterns 120S, 120G, and 120P include a second signal pattern 120S, a second ground pattern 120G, and a second power pattern 120P. The second signal pattern 120S, the second ground pattern 120G, and the second power pattern 120P are separated from each other.

According to some embodiments, the second seed layer is etched to form a plurality of second seed patterns 127. The second seed patterns 127 are separated from each other.

Referring to FIG. 2J, according to some embodiments, a fourth dielectric layer 104, a third seed pattern 137, and third conductive patterns 130S, 130G, and 130P are formed on the third dielectric layer 103. The fourth dielectric layer 104, the third seed pattern 137, and the third conductive patterns 130S, 130G, and 130P are formed by the same method used to form the second dielectric layer 102, the first seed pattern 117, and the first conductive patterns 110S, 110G, and 110P described above with reference to FIGS. 2E to 2H.

According to some embodiments, a fifth dielectric layer 105 is formed on the fourth dielectric layer 104 and covers the fourth dielectric layer 104 and the third conductive patterns 130S, 130G, and 130P. The fifth dielectric layer 105 is patterned to form fourth openings in the fifth dielectric layer 105. The fourth openings expose top surfaces of the third conductive patterns 130S, 130G, and 130P.

According to some embodiments, as each of the under-bump patterns 160 includes the second part 162, each of the fourth and fifth dielectric layers 104 and 105 have no undulations or reduced undulations at a top surface thereof.

Referring to FIG. 2K, according to some embodiments, a fourth seed pattern 147, fourth conductive patterns 140S, 140G, and 140P, and a sixth dielectric layer 106 are formed on the fifth dielectric layer 105. The fourth seed pattern 147 and the fourth conductive patterns 140S, 140G, and 140P are formed by the same method used to form the first seed pattern 117 and the first conductive patterns 110S, 110G, and 110P described with reference to FIGS. 2F to 2H. The sixth dielectric layer 106 is formed by substantially the same method used to form the second dielectric layer 102 described with reference to FIG. 2E. The sixth dielectric layer 106 has holes that expose corresponding top surfaces of the fourth conductive patterns 140S, 140G, and 140P. As each of the under-bump patterns 160 includes the second part 162, the sixth dielectric layer 106 has no undulations or reduced undulations at a top surface thereof.

According to some embodiments, pad seed patterns 157 and bonding pads 150 are formed in and on the sixth dielectric layer 106. The pad seed patterns 157 and the bonding pads 150 are formed by substantially the same method used to form the first seed pattern 117 and the first conductive patterns 110S, 110G, and 110P described with reference to FIGS. 2F to 2H.

For example, according to some embodiments, the forming of the pad seed patterns 157 and the bonding pads 150 includes forming a pad seed layer on the sixth dielectric layer 106, forming on the pad seed layer a resist pattern that has guide openings, performing an electroplating process in which the pad seed layer is used as an electrode, removing the resist pattern to expose a portion of the pad seed layer, and then etching the exposed portion of the pad seed layer. The pad seed layer is etched to form a plurality of pad seed patterns 157. The plurality of pad seed patterns 157 are separated from each other.

According to some embodiments, the electroplating process forms the bonding pads 150 in the holes and the guide openings. The bonding pads 150 include a signal bonding pad 150S, a ground bonding pad 150G, and a power bonding pad 150P. The signal bonding pad 150S, the ground bonding pad 150G, and the power bonding pad 150P are separated from each other. Afterwards, the resist pattern is removed to expose the top surface of the sixth dielectric layer 106. Through the processes described above, a redistribution substrate 100 can be manufactured.

Referring to FIG. 2L, according to some embodiments, a semiconductor chip 200 is prepared which includes a plurality of chip pads 205. The semiconductor chip 200 is disposed on the sixth dielectric layer 106 so as to allow the chip pads 205 to align with corresponding bonding pads 150. A plurality of bonding bumps 250 are formed between the semiconductor chip 200 and the redistribution substrate 100. The bonding bumps 250 are coupled to corresponding chip pads 205 and the bonding pads 150.

According to some embodiments, a molding layer 400 is formed on the sixth dielectric layer 106 and that encapsulates the semiconductor chip 200. The molding layer 400 further extends into a gap between the sixth dielectric layer 106 and the semiconductor chip 200, thereby encapsulating the bonding bumps 250.

According to other embodiments, an under-fill layer is further formed between the sixth dielectric layer 106 and the semiconductor chip 200.

Referring to FIG. 2M, according to some embodiments, the release layer 990 and the carrier substrate 900 are removed from the first dielectric layer 101 to expose a bottom surface 101b of the first dielectric layer 101 and bottom surfaces of the under-bump seed patterns 170. A physical method can be used to remove the release layer 990 and the carrier substrate 900.

Referring to FIG. 2N, according to some embodiments, each of the under-bump seed patterns 170 is partially removed to expose bottom surfaces 160b of the under-bump patterns 160. An etching process partially removes the under-bump seed patterns 170. The etching process may be a wet etching process. In the etching process, the under-bump patterns 160 and the first dielectric layer 101 each have an etch selectivity with respect to the under-bump seed pattern 170. Therefore, the under-bump patterns 160 and the first dielectric layer 101 remain after the etching process terminates.

According to some embodiments, the partial removal of the under-bump seed pattern 170 causes the bottom surfaces 160b of the under-bump patterns 160 to be located at a lower level than the bottom surface 101b of the first dielectric layer 101. A level difference between the bottom surfaces 160b of the under-bump patterns 160 and the bottom surface 101b of the first dielectric layer 101 is substantially the same as the first thickness T11 (see FIG. 1C) of each of the under-bump seed patterns 170.

After the etching process, according to some embodiments, each under-bump seed pattern 170 has an undercut. The undercut of the under-bump seed pattern 170 is formed between the first dielectric layer 101 and the first part 161 of a corresponding under-bump pattern 160. Therefore, as shown in FIG. 1C, the under-bump seed pattern 170 has a lowermost surface 170b at a lower level than the bottom surface 160b of the under-bump pattern 160.

In some embodiments, conditions of the etching process can be adjusted such that, as described with reference to FIG. 1G, the lowermost surface 170b of the under-bump seed pattern 170 is located at substantially the same level as the bottom surface 160b of the under-bump pattern 160.

Referring back to FIGS. 1A and 1B, according to some embodiments, solder patterns 500 are formed on corresponding exposed bottom surfaces 160b of the under-bump patterns 160. The forming of the solder patterns 500 includes a solder-ball attaching process.

According to some embodiments, an adhesive force between the solder pattern 500 and the under-bump seed pattern 170 is relatively small. For example, the adhesive force between the solder pattern 500 and the under-bump seed pattern 170 is less than that between the solder pattern 500 and the under-bump pattern 160. According to some embodiments, because the solder pattern 500 is formed on the under-bump pattern 160 after the under-bump seed pattern 170 is partially removed, the solder pattern 500 can directly contact the under-bump pattern 160. The solder pattern 500 is rigidly bonded to the under-bump pattern 160. Through the processes described above, a semiconductor package 1 is fabricated.

A single semiconductor package 1 has been illustrated and described for brevity of description, but methods of fabricating the semiconductor package 1 are not limited to chip-level fabrication. For example, the semiconductor packages 1 can be fabricated at a chip, panel, or a wafer level.

Figure 3:
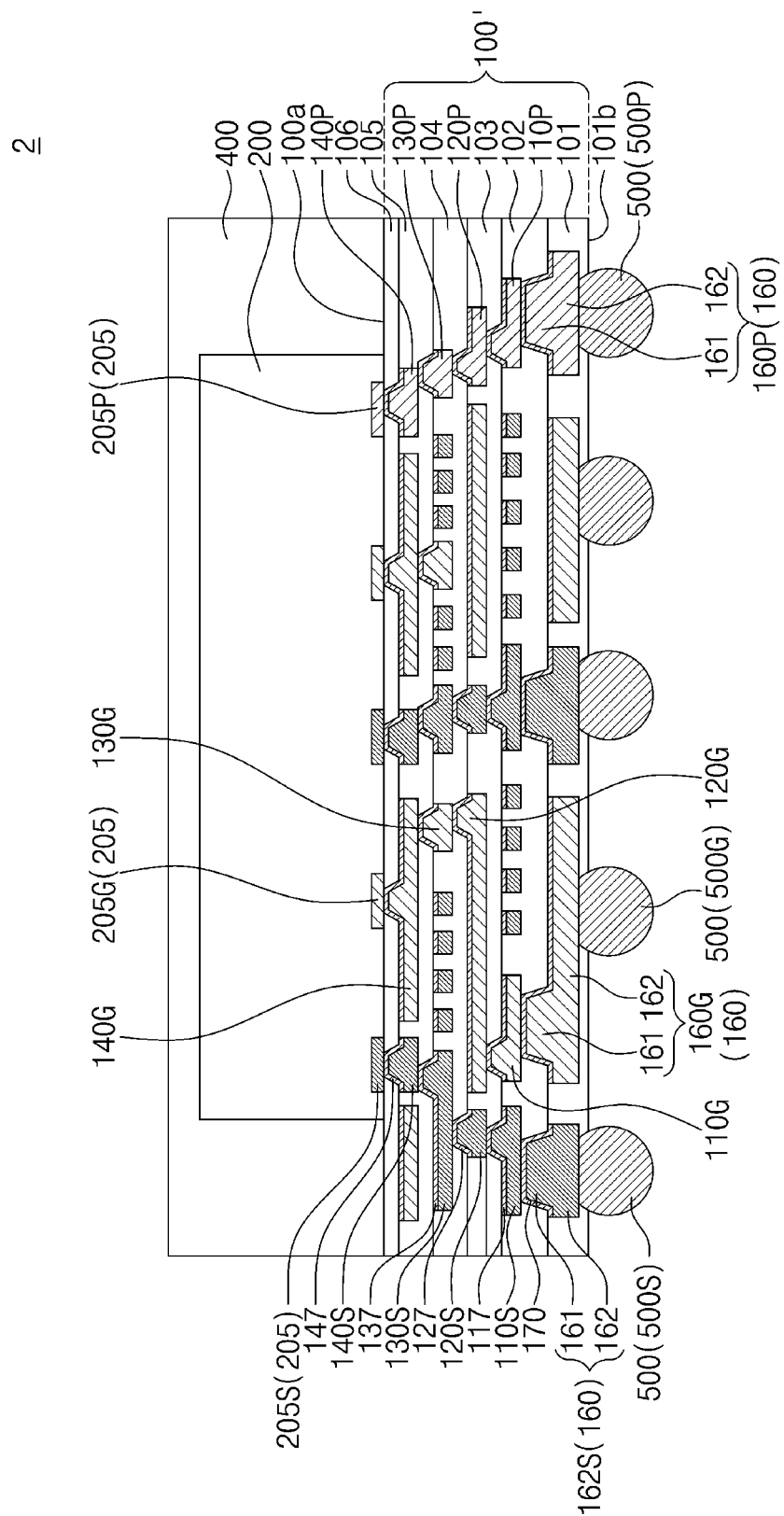
FIG. 3 is a cross-sectional view of a semiconductor package according to some embodiments.

FIG. 3 is a cross-sectional view of a semiconductor package according to some embodiments. A duplicate description of elements described above will be omitted below.

Referring to FIG. 3, according to some embodiments, a semiconductor package 2 includes a redistribution substrate 100', solder patterns 500, a semiconductor chip 200, and a molding layer 400. The solder patterns 500, the semiconductor chip 200, and the molding layer 400 are substantially the same as those described with reference to FIGS. 1A to 1G. In contrast, the semiconductor package 2 does not include the bonding bumps 250.

According to some embodiments, the redistribution substrate 100' includes first, second, third, fourth, fifth, and sixth dielectric layers 101, 102, 103, 104, 105, and 106; first, second, third, and fourth conductive patterns 110S, 110G, 110P, 120S, 120G, 120P, 130S, 130G, 130P, 140S, 140G, and 140P; first, second, third, and fourth seed patterns 117, 127, 137, and 147; under-bump seed patterns 170, and under-bump patterns 160. The first, second, third, fourth, fifth, and sixth dielectric layers 101, 102, 103, 104, 105, and 106 and the first, second, third, and fourth conductive patterns 110S, 110G, 110P, 120S, 120G, 120P, 130S, 130G, 130P, 140S, 140G, and 140P are similar to those described with reference to FIGS. 1A to 1G. In contrast, the redistribution substrate 100' does not include the bonding pad 150 shown in FIG. 1B, and the semiconductor chip 200 directly physically contacts a first surface 100a of the redistribution substrate 100'. For example, the sixth dielectric layer 106 directly physically contacts a bottom surface of the semiconductor chip 200. The fourth conductive patterns 140S, 140G, and 140P are electrically connected without bonding pads to chip pads 205 of the semiconductor chip 200. For example, the fourth seed patterns 147 are interposed and in direct contact with the corresponding chip pads 205 and the corresponding fourth conductive patterns 140G, 140G, and 140P. A fourth signal pattern 140S, a fourth ground pattern 140G, and a fourth power pattern 140P are coupled through the fourth seed patterns 147 to a signal chip pad 205S, a ground chip pad 205G, and a power chip pad 205P.

In contrast to embodiments described with reference to FIGS. 1A and 1B, each of the first, second, third, and fourth conductive patterns 110S, 110G, 110P, 120S, 120G, 120P, 130S, 130G, 130P, 140S, 140G, and 140P is less wide at its top surface than at its bottom surface. In a plan view, bottom-surface shapes and their arrangements of the first signal pattern 110S and the first ground pattern 110G are similar to the top-surface shapes and the arrangements of the first signal pattern 110S and the first ground pattern 110G described with reference to FIG. 1E. In a plan view, bottom-surface shapes and arrangements of the second signal pattern 120S and the second ground pattern 120G are similar to the top-surface shapes and arrangements of the second signal pattern 120S and the second ground pattern 120G described with reference to FIG. 1F.

According to some embodiments, the first seed patterns 117 are disposed on corresponding top surfaces of the first conductive patterns 110S, 110G, and 110P. For example, the first seed patterns 117 are interposed between the first conductive patterns 110S, 110G, and 110P and the third dielectric layer 103 and between the first conductive patterns 110S, 110G, and 110P and the second conductive patterns 120S, 120G, and 120P. The second seed patterns 127 are disposed on corresponding top surfaces of the second conductive patterns 120S, 120G, and 120P. The third seed patterns 137 are disposed on corresponding top surfaces of the third conductive patterns 130S, 130G, and 130P. The fourth seed patterns 147 are disposed on corresponding top surfaces of the fourth conductive patterns 140S, 140G, and 140P.

According to some embodiments, the under-bump patterns 160 are substantially the same as those described with reference to FIGS. 1A, 1B, and 1D. For example, each of the under-bump patterns 160 is less wide at its first part 161 than at its second part 162. In contrast, the first part 161 of the under-bump pattern 160 corresponds to an upper portion of the under-bump pattern 160. For example, the first part 161 of the under-bump pattern 160 is disposed on the second part 162 of the under-bump pattern 160. The first part 161 of the under-bump pattern 160 is interposed between the second part 162 of the under-bump pattern 160 and a corresponding pattern of the first conductive patterns 110S, 110G, and 110P. Each of the solder patterns 500 is attached to a bottom surface of the second part 162 of the under-bump pattern 160. The second part 162 of the under-bump pattern 160 serves as a solder pad. The under-bump patterns 160 include a signal under-bump pattern 160S, a ground under-bump pattern 160G, and a power under-bump pattern 160P. As described above, the ground under-bump pattern 160G and the power under-bump pattern 160P each serve as a routing or line part. For example, a plurality of first signal patterns 110S include a plurality of first signal line patterns that lie on and vertically overlap the second part 162 of a single ground under-bump pattern 160G. The under-bump seed pattern 170 is interposed between the under-bump pattern 160 and the second dielectric layer 102. The under-bump seed pattern 170 covers a top surface and a sidewall of the first part 161 of the under-bump pattern 160, and also a top surface of the second part 162 of the under-bump pattern 160. The under-bump seed pattern 170 is not provided on a bottom surface of the under-bump pattern 160.

Figure 4:
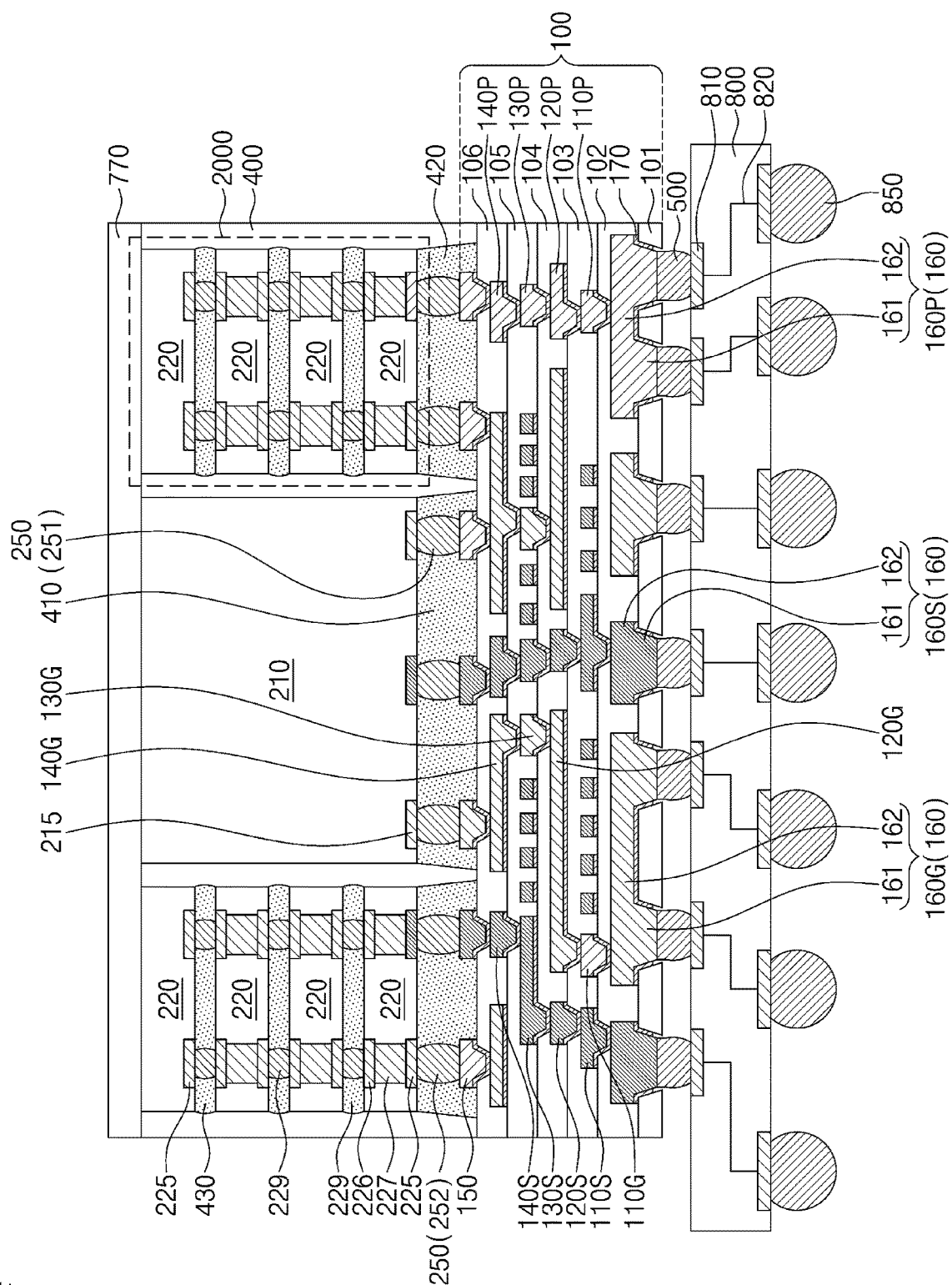
FIG. 4 is a cross-sectional view of a semiconductor package according to some embodiments.

FIG. 4 is a cross-sectional view of a semiconductor package according to some embodiments.

Referring to FIG. 4, according to some embodiments, a semiconductor package 3 include a package substrate 800, a redistribution substrate 100, solder patterns 500, a first semiconductor chip 210, a chip stack 2000, bonding bumps 250, and a molding layer 400.

According to some embodiments, the package substrate 800 includes a printed circuit board. The package substrate 800 includes metal lines 820 and metal pads 810. The metal lines 820 are disposed in the package substrate 800. In this description, the phrase "coupled to the package substrate 800" means "coupled to the metal lines 820." The metal pads 810 are disposed on a top surface of the package substrate

800 and electrically connected to the metal lines 820. External coupling terminals 850 are disposed on a bottom surface of the package substrate 800, and are coupled to corresponding metal lines 820. External electrical signals can be transmitted through the external coupling terminals 850 to the metal lines 820. Solder balls may be used as the external coupling terminals 850. The external coupling terminals 850 include a metal, such as a solder material.

According to some embodiments, the redistribution substrate 100 is disposed on the package substrate 800. The redistribution substrate 100 is as an interposer substrate. The solder patterns 500 are aligned with corresponding metal pads 810 of the package substrate 800. The redistribution substrate 100 is electrically connected through the solder patterns 500 to the package substrate 800. The redistribution substrate 100, the solder patterns 500, and the molding layer 400 are substantially the same as those described with reference to FIG. 1A to 1G. The bonding bumps 250 include first bonding bumps 251 and second bonding bumps 252.

According to some embodiments, the first semiconductor chip 210 is mounted on the top surface of the redistribution substrate 100. The first bonding bumps 251 are interposed between chip pads 215 of the first semiconductor chip 210 and bonding pads 150. The first semiconductor chip 210 is substantially the same as the semiconductor chip 200 described with reference to FIGS. 1A and 1B, and an arrangement, function, and material of the first bonding bumps 251 is substantially the same as those of the bonding bumps 250 described with reference to FIGS. 1A and 1B. A pitch of the first bonding bumps 251 is less than that of the solder patterns 500. The pitch of the first bonding bumps 251 is less than that of the external coupling terminals 850.

According to some embodiments, the chip stack 2000 is mounted on the top surface of the redistribution substrate 100. The chip stack 2000 is laterally spaced apart from the first semiconductor chip 210. The chip stack 2000 includes a plurality of second semiconductor chips 220. Each of the second semiconductor chips 220 is the same as or similar to the semiconductor chip 200 described with reference to FIGS. 1A and 1B. In contrast, the second semiconductor chips 220 are of different types from the first semiconductor chip 210. For example, the first semiconductor chip 210 may be one of a logic chip, a buffer chip, or a system-on-chip (SOC), and each of the second semiconductor chips 220 may be another of a logic chip, a buffer chip, or a system-on-chip (SOC). The memory chip may include a high-bandwidth-memory (HBM) chip. For example, a lowermost second semiconductor chip 220 may be a logic chip, and the remaining second semiconductor chips 220 may be high-bandwidth-memory (HBM) chips. The first semiconductor chip 210 is a logic chip that is of a different type from the lowermost second semiconductor chip 220. For example, the lowermost second semiconductor chip 220 is a controller chip, and the first semiconductor chip 210 is an application specific integrated circuit (ASIC) chip or an application processor (AP) chip. The ASIC chip includes an application specific integrated circuit (ASIC).

According to some embodiments, each of the second semiconductor chips 220 includes a lower pad 225, a through electrode 227, and an upper pad 226. The lower pad 225 and the upper pad 226 are respectively provided on a bottom surface and a top surface of the second semiconductor chip 220. One or more of the lower and upper pads 225 and 226 is electrically connected to integrated circuits of the second semiconductor chip 220. The through electrode 227 is disposed in the second semiconductor chip 220, and is coupled to the lower and upper pads 225 and 226. An uppermost second semiconductor chip 220 includes the lower pad 225, but not the through electrode 227 or the upper pad 226. However, in other embodiments, the uppermost second semiconductor chip 220 further includes the through electrode 227 and the upper pad 226. An interposer bump 229 is interposed between two neighboring second semiconductor chips 220, and is coupled to the lower and upper pads 225 and 226. Therefore, a plurality of second semiconductor chips 220 can be electrically connected to each other. The interposer bump 229 may include a solder, a pillar, or a bump. The interposer bump 229 includes a solder material, but embodiments of the present inventive concepts are not limited thereto.

According to other embodiments, the interposer bump 229 is omitted. In this case, neighboring second semiconductor chips 220 are connected through the lower and upper pads 225 and 226 that face each other and are directly bonded to each other.

According to some embodiments, a second bonding bump 252 is interposed between the lowermost second semiconductor chip 220 and the redistribution substrate 100, and is coupled to the lower pad 225 and a corresponding bonding pad 150. Therefore, the second semiconductor chips 220 can be electrically connected through the redistribution substrate 100 to the first semiconductor chip 210 and the solder patterns 500. An arrangement, function, and material of a plurality of second bonding bumps 252 is substantially the same as those of the bonding bumps 250 described with reference to FIGS. 1A and 1B. A pitch of the second bonding bumps 252 is less than that of the solder patterns 500 and that of the external coupling terminals 850.

According to some embodiments, a plurality of chip stacks 2000 are provided. The plurality of chip stacks 2000 are laterally spaced apart from each other. The first semiconductor chip 210 is disposed between the chip stacks 2000. Therefore, reduced electrical pathways can be provided between the first semiconductor chip 210 and the chip stacks 2000.

According to some embodiments, a first under-fill layer 410 is disposed in a first gap between the redistribution substrate 100 and the first semiconductor chip 210, thereby encapsulating the first bonding bump 251. The first under-fill layer 410 includes a dielectric polymer, such as an epoxy-based polymer. Second under-fill layers 420 are disposed in corresponding second gaps between the redistribution substrate 100 and the chip stacks 2000, thereby encapsulating corresponding second bonding bumps 252. The second under-fill layers 420 include a dielectric polymer, such as an epoxy-based polymer. However, in other embodiments, the second under-fill layers 420 are omitted, and the first under-fill layer 410 further extends into the second gaps, thereby encapsulating the first bonding bumps 251 and the second bonding bumps 252.

According to some embodiments, a third under-fill layer 430 is interposed between the second semiconductor chips 220, thereby encapsulating the interposer bump 229. The third under-fill layer 430 includes a dielectric polymer, such as an epoxy-based polymer.

According to some embodiments, the molding layer 400 is disposed on the redistribution substrate 100 and covers a sidewall of the first semiconductor chip 210 and sidewalls of the second semiconductor chips 220. The molding layer 400 exposes a top surface of the first semiconductor chip 210 and a top surface of the uppermost second semiconductor chip 220. However, in other embodiments, the molding layer 400 covers the top surface of the first semiconductor chip 210 and the top surface of the uppermost second semiconductor chip 220. In other embodiments, the first and second under-fill layers 410 and 420 are omitted, and the molding layer 400 extends into the first and second gaps.

According to some embodiments, a conductive plate 770 is further disposed on the top surface of the first semiconductor chip 210, a top surface of the chip stack 2000, and a top surface of the molding layer 400. The conductive plate 770 may further extend onto a sidewall of the molding layer 400. The conductive plate 770 protects the first semiconductor chip 210 and the chip stack 2000 against the external environment. For example, the conductive plate 770 can absorb external physical impacts. The conductive plate 770 includes a thermally conductive material, and serves as a heat sink or a heat slug. For example, when the semiconductor package 3 operates, the conductive plate 770 externally discharges heat generated from the redistribution substrate 100, the first semiconductor chip 210, or the second semiconductor chips 210. The conductive plate 770 is electrically conductive and serves as an electromagnetic field shield layer. For example, the conductive plate 770 shields electromagnetic interference (EMI) between the first semiconductor chip 210 and the second semiconductor chips 220. The conductive plate 770 is electrically grounded through the redistribution substrate 100, and prevents the first semiconductor chip 210 or the second semiconductor chips 220 from being electrically damaged by an electrostatic discharge (ESD).

In addition, a third semiconductor chip may be further mounted on the redistribution substrate 100. The third semiconductor chip may be of a different type from the first and second semiconductor chips 210 and 220. Furthermore, the molding layer 400 may be omitted.

According to some embodiments, the semiconductor package 3 can be fabricated by using the redistribution substrate 100' described with reference to FIG. 3. In this case, the bonding bumps 250, the first under-fill layer 410, and the second under-fill layers 420 can be omitted from the semiconductor package 3. In addition, an arrangement relationship between the redistribution substrate 100' and the first and second semiconductor chips 210 and 220 is substantially the same as that between the redistribution substrate 100' and the semiconductor chip 200 described with reference to FIG. 3.

Figure 5:
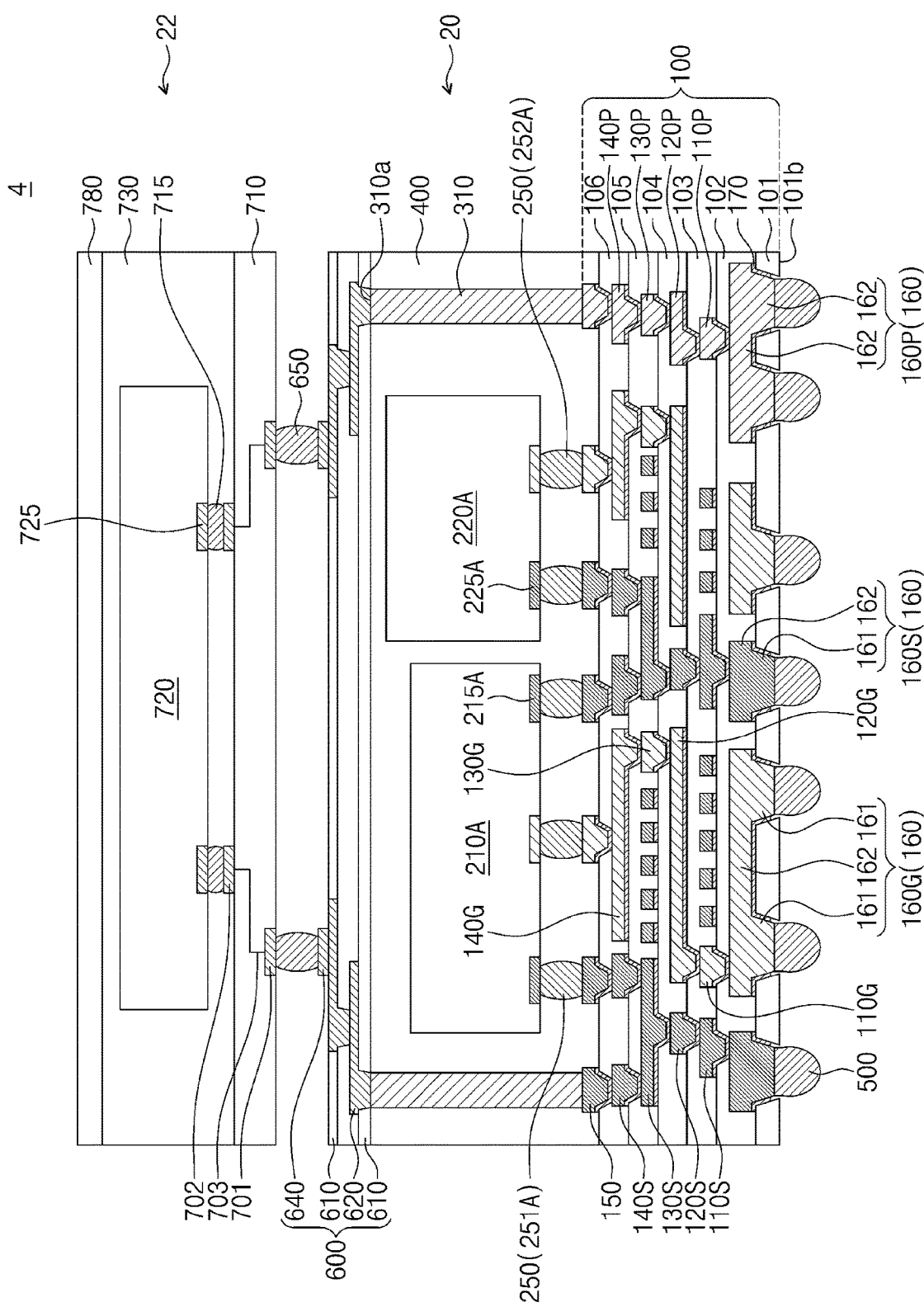
FIG. 5 is a cross-sectional view of a semiconductor package according to some embodiments.

FIG. 5 is a cross-sectional view of a semiconductor package according to some embodiments.

Referring to FIG. 5, according to some embodiments, a semiconductor package 4 includes a lower semiconductor package 20 and an upper semiconductor package 22. The lower semiconductor package 20 includes a redistribution substrate 100, solder patterns 500, bonding bumps 250, a first semiconductor chip 210A, a second lower semiconductor chip 220A, a molding layer 400, and a conductive structure 310. The redistribution substrate 100, the solder patterns 500, and the molding layer 400 are substantially the same as those described with reference to FIGS. 1A to 1G.

According to some embodiments, the second lower semiconductor chip 220A is laterally spaced apart from the first lower semiconductor chip 210A. The second lower semiconductor chip 220A is of a different type from the first semiconductor chip 210A. For example, the first lower semiconductor chip 210A may be one of a logic chip, a memory chip, or a power management chip, and the second lower semiconductor chip 220A may be another of a logic chip, a memory chip, or a power management chip. The logic chip may be an applicant specific integrated circuit (ASIC) chip or an application processor (AP) chip. The power management chip may be a power management integrated circuit (PMIC). For example, the first lower semiconductor chip 210A is an ASIC chip, and the second lower semiconductor chip 220A is a power management chip. Each of the first and second lower semiconductor chips 210A and 220A is similar to the semiconductor chip 200 described with reference to FIGS. 1A and 1B. However, in other embodiments, one or more of the first and second lower semiconductor chips 210A and 220A are omitted. In other embodiments, a third semiconductor chip is further mounted on a top surface of the redistribution substrate 100.

According to some embodiments, the bonding bumps 250 include first bonding bumps 251A and second bonding bumps 252A. The first bonding bumps 251A are similar to the first bonding bumps 251 described with reference to FIG. 3, and the second bonding bumps 252A are similar to the second bonding bumps 252 described with reference to FIG. 3. The first lower semiconductor chip 210A includes chip pads 215A that are electrically connected through the first bonding bumps 251A to the redistribution substrate 100. The second lower semiconductor chip 220A includes chip pads 225A that are electrically connected through the second bonding bumps 252A to the redistribution substrate 100. Accordingly, the second lower semiconductor chip 220A can be electrically connected through the redistribution substrate 100 to the first lower semiconductor chip 210A.

According to some embodiments, the conductive structure 310 is disposed on the top surface of the redistribution substrate 100, and is coupled to a corresponding bonding pad 150. The conductive structure 310 is laterally spaced apart from the first and second lower semiconductor chips 210A and 220A. In a plan view, the conductive structure 310 is located on an edge region of the redistribution substrate 100. A metal pillar is disposed on the redistribution substrate 100, thereby forming the conductive structure 310. For example, the conductive structure 310 is a metal pillar. The conductive structure 310 is electrically connected to the redistribution substrate 100. For example, the conductive structure 310 is electrically connected through the redistribution substrate 100 to the first lower semiconductor chip 210A, the second lower semiconductor chip 220A, or the solder pattern 500. The conductive structure 310 includes a metal, such as copper.

According to some embodiments, the molding layer 400 is disposed on the top surface of the redistribution substrate 100, and covers the first and second lower semiconductor chips 210A and 220A. The molding layer 400 covers sidewalls of the conductive structure 310. The molding layer 400 has a sidewall aligned with that of the redistribution substrate 100. The molding layer 400 exposes a top surface 310a of the conductive structure 310.

According to some embodiments, the lower semiconductor package 20 further includes an upper redistribution layer 600. The upper redistribution layer 600 is disposed on a top surface of the molding layer 400. The upper redistribution layer 600 includes upper dielectric layers 610, upper redistribution patterns 620, and upper bonding pads 640. The upper dielectric layers 610 are stacked on the molding layer 400. The upper dielectric layers 610 include a photosensitive polymer. Each of the upper redistribution patterns 620 includes a via part in the upper dielectric layers 610 and a line part between the upper dielectric layers 610. The upper redistribution patterns 620 include a metal, such as copper. At least one of the upper redistribution patterns 620 contacts the top surface 310a of the conductive structure 310. The upper bonding pads 640 are disposed on an uppermost layer of the upper dielectric layers 610, and are coupled to the upper redistribution patterns 620. The upper bonding pad 640 is electrically connected through the upper redistribution pattern 620 and the conductive structure 310 to the solder pattern 500, the first lower semiconductor chip 210A, or the second lower semiconductor chip 220A. The presence of the upper redistribution patterns 620 prevents the upper bonding pad 640 from vertically aligning with the conductive structure 310.

Alternatively, in other embodiments, the lower semiconductor package 20 is fabricated by using the redistribution substrate 100' described with reference to FIG. 3. In this case, the bonding bumps 250 are omitted. In addition, an arrangement relationship between the redistribution substrate 100' and the first and second semiconductor chips 210A and 220A is substantially the same as that between the redistribution substrate 100' and the semiconductor chip 200 described with reference to FIG. 3.

According to some embodiments, the upper semiconductor package 22 is disposed on the lower semiconductor package 20. For example, the upper semiconductor package 22 is placed on the upper redistribution layer 600. The upper semiconductor package 22 includes an upper substrate 710, an upper semiconductor chip 720, and an upper molding layer 730. The upper substrate 710 is a printed circuit board. However, in other embodiments, the upper substrate 710 is a redistribution layer. The upper substrate 710 can be fabricated identically or similarly to the redistribution substrate 100 described with reference to FIGS. 2A to 2K. A first connection pad 701 and a second connection pad 702 are respectively disposed on a bottom surface and a top surface of the upper substrate 710. A wiring line 703 is disposed in the upper substrate 710 that couples the first and second connection pads 701 and 702. The wiring line 703 is schematically illustrated, and may have a different shape and arrangement than that shown. The first connection pad 701, the second connection pad 702, and the wiring line 703 include a conductive material, such as a metal.

According to some embodiments, the upper semiconductor chip 720 is disposed on the upper substrate 710. The upper semiconductor chip 720 includes integrated circuits that may include a memory circuit, a logic circuit, or a combination thereof. The upper semiconductor chip 720 is of a different type from the first and second lower semiconductor chips 210A and 220A. For example, the upper semiconductor chip 720 is a memory chip. A bump terminal 715 is interposed between the upper substrate 710 and the upper semiconductor chip 720, and is coupled to the second connection pad 702 and a chip pad 725 of the upper semiconductor chip 720. The upper semiconductor chip 720 is electrically connected to the first connection pad 701 through the bump terminal 715 and the wiring line 703. However, in other embodiments, the bump terminal 715 is omitted, and the chip pad 725 is directly coupled to the second connection pad 702.

According to some embodiments, the upper molding layer 730 is disposed on the upper substrate 710 and covers the upper semiconductor chip 720. The upper molding layer 730 includes a dielectric polymer, such as an epoxy-based polymer.

According to some embodiments, the upper semiconductor package 22 furthers include a thermal radiation structure 780. The thermal radiation structure 780 includes one or more of a heat sink, a heat slug, or a thermal interface material (TIM) layer. The thermal radiation structure 780 includes, for example, a metal. The thermal radiation structure 780 is disposed on a top surface of the upper molding layer 730. The thermal radiation structure 780 may further extend onto a sidewall of the upper molding layer 730 or a sidewall of the molding layer 400.

According to some embodiments, the semiconductor package 4 further includes a connection terminal 650. The connection terminal 650 is interposed between and coupled to the upper bonding pad 640 and the first connection pad 701. Therefore, the upper semiconductor package 22 can be electrically connected through the connection terminal 650 to the first semiconductor chip 210A, the second lower semiconductor chip 220A, and the solder patterns 500. The electrical connection of the upper semiconductor package 22 includes an electrical connection with integrated circuits in the upper semiconductor chip 720. The connection terminal 650 may be a solder, a bump, or a combination thereof. The connection terminal 650 includes a solder material.

In other embodiments, the upper substrate 710 is omitted, and the connection terminal 650 are directly coupled to the chip pad 725 of the upper semiconductor chip 720. In this case, the upper molding layer 730 is in direct contact with a top surface of the upper redistribution layer 600. In other embodiments, the upper substrate 710 and the connection terminal 650 are omitted, and the chip pad 725 of the upper semiconductor chip 720 is directly coupled to the upper bonding pad 640.

Figure 6:
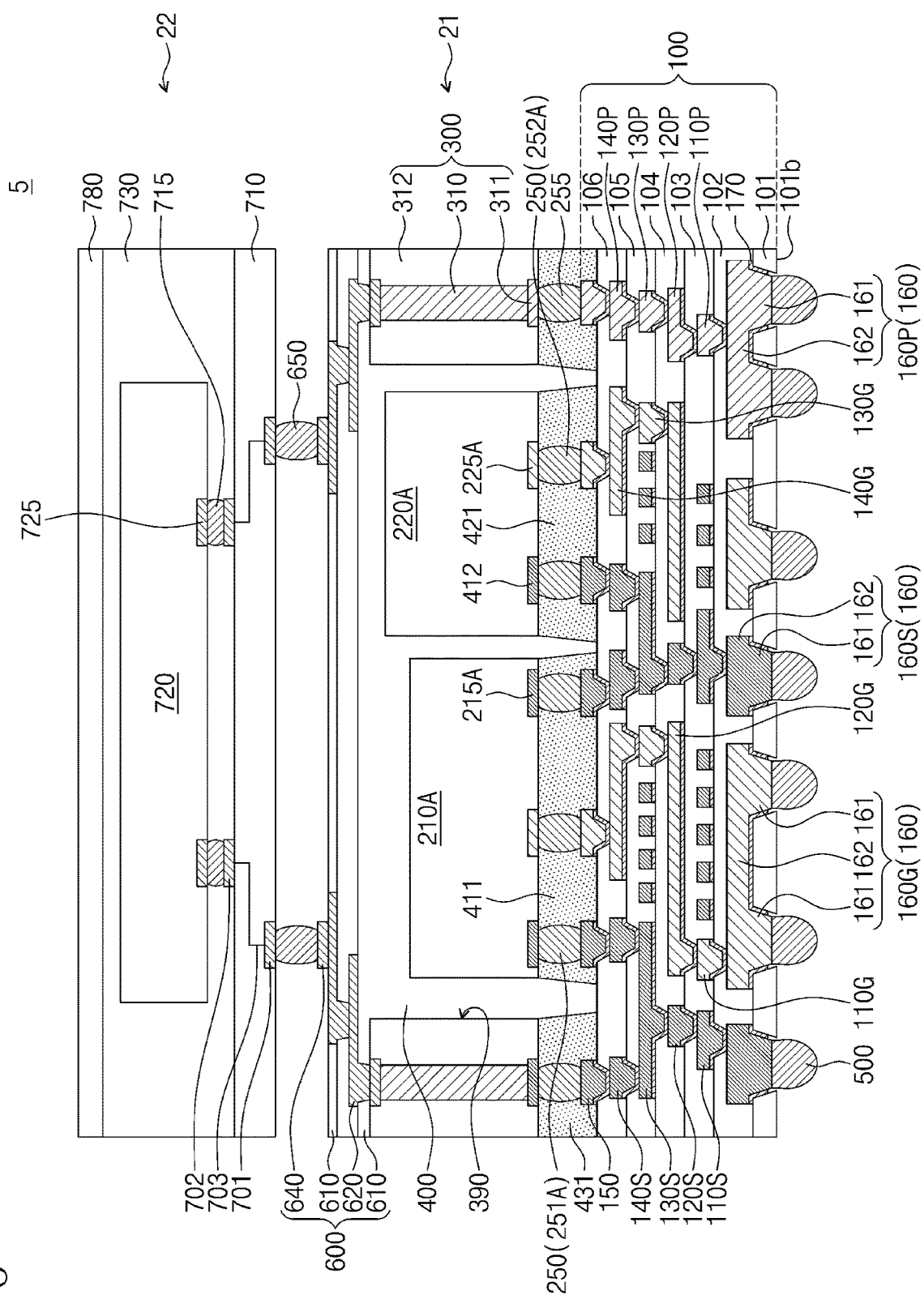
FIG. 6 is a cross-sectional view of a semiconductor package according to some embodiments.

FIG. 6 is a cross-sectional view of a semiconductor package according to some embodiments.

Referring to FIG. 6, according to some embodiments, a semiconductor package 5 includes a lower semiconductor package 21 and an upper semiconductor package 22. The lower semiconductor package 21 includes a redistribution substrate 100, solder patterns 500, bonding bumps 250, a first lower semiconductor chip 210A, a second lower semiconductor chip 220A, a molding layer 400, and a connection substrate 300. The redistribution substrate 100, the solder patterns 500, the bonding bumps 250, and the molding layer 400 are the same as or similar to those described with reference to FIGS. 1A to 1G. The first lower semiconductor chip 210A and the second lower semiconductor chip 220A are substantially the same as the first lower semiconductor chip 210A and the second lower semiconductor chip 220A, respectively, described with reference to FIG. 5. The bonding bumps 250 include first bonding bumps 251A and second bonding bumps 252A. The first bonding bumps 251A and the second bonding bumps 252A are substantially the same as the first bonding bumps 251A and the second bonding bumps 252A, respectively, described with reference to FIG. 5.

According to some embodiments, the semiconductor package 5 furthers include a first under-fill pattern 411 and a second under-fill pattern 421. The first under-fill pattern 411 is disposed in a first gap between the redistribution substrate 100 and the first lower semiconductor chip 210A. The first under-fill pattern 411 encapsulates the first bonding bumps 251A. The second under-fill pattern 421 is disposed in a second gap between the redistribution substrate 100 and the second lower semiconductor chip 220A, thereby encapsulating the second bonding bumps 252A.

According to some embodiments, the connection substrate 300 is disposed on the redistribution substrate 100. The connection substrate 300 includes a substrate hole 390 that penetrates therethrough. For example, formation of the connection substrate 300 may performed by preparing a printed circuit board and forming the substrate hole 390 penetrating top and bottom surfaces of the printed circuit board. In a plan view, the substrate hole 390 is formed on a central portion of the redistribution substrate 100. The first and second lower semiconductor chips 210A and 220A are disposed in the substrate hole 390 of the connection substrate 300. The first and second lower semiconductor chips 210A and 220A are spaced apart from an inner wall of the connection substrate 300.

According to some embodiments, the connection substrate 300 includes a base layer 320 and a conductive structure 310. In addition, the base layer 320 includes a plurality of stacked layers. The base layer 320 includes a dielectric material. For example, the base layer 320 may include at least one of a carbon-based material, a ceramic, or a polymer. The substrate hole 390 penetrates the base layer 320. The conductive structure 310 is disposed in the base layer 320. The connection substrate 300 furthers include a first pad 311 and a second pad 312. The first pad 311 is disposed on a bottom surface of the conductive structure 310. The second pad 312 is disposed on a top surface of the conductive structure 310. The second pad 312 is electrically connected through the conductive structure 310 to the first pad 311. The conductive structure 310, the first pad 311, and the second pad 312 includes, for example, at least one of copper, aluminum, tungsten, titanium, tantalum, iron, or any alloy thereof.

According to some embodiments, a connection bump 255 is disposed between the redistribution substrate 100 and the connection substrate 300. The connection bump 255 is interposed between and coupled to the first pad 311 and a corresponding bonding pad 150. The conductive structure 310 is electrically connected through the connection bump 255 to the redistribution substrate 100. The connection bump 255 includes one or more of a solder ball, a bump, and a pillar. The connection bump 255 includes a metal. A third under-fill pattern 431 is disposed in a gap between the redistribution substrate 100 and the connection substrate 300, thereby encapsulating the connection bump 255. The third under-fill pattern 431 includes a dielectric polymer.

According to some embodiments, the molding layer 400 is disposed on the first lower semiconductor chip 210A, the second lower semiconductor chip 220A, and the connection substrate 300. The molding layer 400 is interposed between the first lower semiconductor chip 210A and the second lower semiconductor chip 220A, between the first lower semiconductor chip 210A and the connection substrate 300, and between the second lower semiconductor chip 220A and the connection substrate 300. In some embodiments, the molding layer substantially fills the substrate hole 390. According to some embodiments, an adhesive dielectric film is attached to a top surface of the connection substrate 300, top surfaces of the first and second lower semiconductor chips 210A and 220A, and sidewalls of the first and second lower semiconductor chips 210A and 220A, with the result that the molding layer 400 is formed. For example, an Ajinomoto build-up film (ABF) can be used as the adhesive dielectric film. For another example, the molding layer 400 includes a dielectric polymer, such as an epoxy-based polymer. For another example, the first and second under-fill patterns 411 and 421 are omitted, and the molding layer 400 further extends onto a bottom surface of the first lower semiconductor chip 210A and a bottom surface of the second lower semiconductor chip 220A. When the third under-fill pattern 431 is omitted, the molding layer 400 further extends into a gap between the redistribution substrate 100 and the connection substrate 300.

According to some embodiments, the lower semiconductor package 21 further includes an upper redistribution layer 600. The upper redistribution layer 600 is disposed on the molding layer 400 and the connection substrate 300. The upper redistribution layer 600 includes upper dielectric layers 610, upper redistribution patterns 620, and upper bonding pads 640. The upper dielectric layers 610, upper redistribution patterns 620, and upper bonding pads 640 are substantially the same as those described with reference to FIG. 5. However, in other embodiments, at least one of the upper redistribution patterns 620 extends into the molding layer 400, and is thus coupled to the second pad 312.

In other embodiments, the lower semiconductor package 21 can be fabricated by using the redistribution substrate 100' described with reference to FIG. 3. In this case, the bonding bumps 250, the connection bumps 255, and the first, second, and third under-fill patterns 411, 421, and 431 are omitted from the semiconductor package 5. In addition, an arrangement relationship between the redistribution substrate 100' and the first and second semiconductor chips 210A and 220A is substantially the same as that between the redistribution substrate 100' and the semiconductor chip 200 described with reference to FIG. 3.

According to some embodiments, the upper semiconductor package 22 is disposed on the lower semiconductor package 21. For example, the upper semiconductor package 22 is placed on the upper redistribution layer 600 and is connected to the upper redistribution layer 600 by connection terminal 650. The upper semiconductor package 22 includes an upper substrate 710, an upper semiconductor chip 720, and an upper molding layer 730. The upper semiconductor package 22 and the connection terminal 650 are substantially the same as those described with reference to FIG. 5. For example, the connection terminal 650 is interposed between the lower semiconductor package 21 and the upper semiconductor package 22. The upper semiconductor package 22 further includes a thermal radiation structure 780.

According to embodiments of the present inventive concepts, an under-bump pattern includes a first part and a second part that is wider than the first part. As the second part of the under-bump pattern serves as a wiring line, conductive patterns have increased electrical characteristics. The second part of the under-bump pattern reduces undulation at top surfaces of the conductive patterns. Therefore, the conductive patterns have increased electrical connections therebetween. An under-bump seed pattern extends onto a sidewall of the under-bump pattern, and thus the under-bump pattern is stably attached to a dielectric layer. A redistribution substrate and a semiconductor package including the same have increased reliability.

This detailed description of the present inventive concepts should not be construed as limited to embodiments set forth herein, and it is intended that embodiments of the present inventive concepts cover the various combinations, the modifications and variations of this invention without departing from the spirit and scope of the present inventive concepts.

What is claimed is:
1. A semiconductor package, comprising:
   a redistribution substrate that has a first surface and a second surface that face each other;
   a semiconductor chip disposed on the first surface of the redistribution substrate; and
   a plurality of solder patterns disposed on the second surface of the redistribution substrate,
   wherein the redistribution substrate includes:
      a first under-bump pattern; and
      a plurality of second under-bump patterns that are laterally spaced apart from the first under-bump pattern, wherein each of the first under-bump and the plurality of second under-bump patterns includes:
a first part coupled to one of the plurality of solder patterns; and
a second part formed on the first part and that is wider than the first part,
wherein the first part of the first under-bump pattern includes a plurality of first parts,
wherein the second part of the first under-bump pattern is connected to the plurality of the first parts of the first under-bump pattern,
wherein the redistribution substrate further includes an under-bump seed pattern that covers a sidewall of the first part and a bottom surface of the second part of the first under-bump and the plurality of second under-bump patterns, and
a dielectric layer that exposes a lowermost surface of the under-bump seed pattern.

2. The semiconductor package as claimed in claim 1, wherein the lowermost surface of the under-bump seed pattern is located at a higher level than a bottom surface of the first under-bump and the plurality of second under-bump patterns.

3. The semiconductor package as claimed in claim 1, wherein the under-bump seed pattern covers a portion of the sidewall of first part of the first under-bump and the plurality of second under-bump patterns and exposes another portion of the sidewall the first part of first under-bump and the plurality of second under-bump patterns.

4. The semiconductor package as claimed in claim 1, wherein a bottom surface of the first under-bump pattern and the plurality of second under-bump patterns is located at a higher level than the second surface of the redistribution substrate.

5. The semiconductor package as claimed in claim 1, wherein the lowermost surface of the under-bump seed pattern is located at a higher level than the second surface of the redistribution substrate.

6. The semiconductor package as claimed in claim 1,
wherein the redistribution substrate further includes a first conductive pattern disposed on a top surface of the first under-bump pattern and that is electrically connected to the first under-bump pattern,
wherein the first under-bump pattern is thicker than the first conductive pattern.

7. The semiconductor package as claimed in claim 1, wherein a thickness of the first under-bump pattern is in a range from about 5 μm to about 20 μm.

8. The semiconductor package as claimed in claim 1, wherein the second part of the first under-bump pattern is wider than the second part of the plurality of second under-bump patterns.

9. The semiconductor package as claimed in claim 1, wherein each of the plurality of second under-bump patterns includes one first part and one second part.

10. A semiconductor package, comprising:
a redistribution substrate; and
a semiconductor chip disposed on the redistribution substrate,
wherein the redistribution substrate includes:
a first under-bump pattern; and
a plurality of second under-bump patterns that are laterally spaced apart from the first under-bump pattern,
wherein each of the first under-bump pattern and the plurality of second under-bump patterns includes:
a first part; and
a second part formed on the first part and that is wider than the first part,
wherein the first part of the first under-bump pattern includes a plurality of first parts,
wherein the second part of the first under-bump pattern in connected to the plurality of the first parts of the first under-bump pattern,
wherein the second part of the first under-bump pattern is wider than the second part of the plurality of second under-bump patterns,
wherein the redistribution substrate further includes an under-bump seed pattern that covers a sidewall of the first part and a bottom surface of the second part of the first under-bump and the plurality of second under-bump patterns, and
wherein a bottom surface of the first under-bump pattern and the plurality of second under-bump patterns is located at a higher level than a bottom surface of the redistribution substrate.

11. The semiconductor package as claimed in claim 10, wherein the redistribution substrate includes a dielectric layer that does not contact a lowermost surface of the under-bump seed pattern.

12. The semiconductor package as claimed in claim 10, wherein a lowermost surface of the under-bump seed pattern is located at a same or higher level than a bottom surface of the first under-bump and the plurality of second under-bump patterns.

13. The semiconductor package as claimed in claim 10, wherein a lowermost surface of the under-bump seed pattern is located at a higher level than the bottom surface of the redistribution substrate.

14. The semiconductor package as claimed in claim 10, wherein the under-bump seed pattern covers a portion of the sidewall of the first part of the first under-bump and the plurality of second under-bump patterns and exposes another portion of the sidewall of the first part of first under-bump and the plurality of second under-bump patterns.

15. The semiconductor package as claimed in claim 10,
wherein the redistribution substrate further includes a first conductive pattern disposed on a top surface of the first under-bump pattern and that is electrically connected to the first under-bump pattern,
wherein the first under-bump pattern is thicker than the first conductive pattern.

16. The semiconductor package as claimed in claim 10,
wherein the under-bump seed pattern has a first thickness on a bottom surface of the second part of the first under-bump pattern, and
a level difference between a lowermost surface of the under-bump seed pattern and the bottom surface of the redistribution substrate ranges from about 1 to about 10 times the first thickness.

17. A semiconductor package, comprising:
a redistribution substrate; and
a semiconductor chip disposed on the redistribution substrate,
wherein the redistribution substrate includes:
a first under-bump pattern;
a first conductive pattern disposed on a top surface of the first under-bump pattern and that is electrically connected to the first under-bump pattern; and
a plurality of second under-bump patterns that are laterally spaced apart from the first under-bump pattern, wherein each of the first under-bump pattern and the plurality of second under-bump patterns includes:
a first part; and
a second part formed on the first part and that is wider than the first part,
wherein the first part of the first under-bump pattern includes a plurality of first parts,
wherein the second part of the first under-bump pattern is connected to the plurality of the first parts of the first under-bump pattern,
wherein the first under-bump pattern is thicker than the first conductive pattern.

18. The semiconductor package as claimed in claim 17, wherein the redistribution substrate includes an under-bump seed pattern that covers a sidewall of the first part and a bottom surface of the second part of the first under-bump pattern and the plurality of second under-bump patterns and a dielectric layer that exposes a lowermost surface of the under-bump seed pattern.

19. The semiconductor package as claimed in claim 17, wherein a bottom surface of the first under-bump pattern and the plurality of second under-bump patterns is located at a higher level than a bottom surface of the redistribution substrate.

20. The semiconductor package as claimed in claim 17,
wherein the redistribution substrate further includes an under-bump seed pattern that covers a side wall of the first part and a bottom surface of the second part of the first under-bump and the plurality of second under-bump patterns, and
wherein the under-bump seed pattern covers a portion of the sidewall of first part of the first under-bump and the plurality of second under-bump patterns and exposes another portion of the sidewall the first part of first under-bump and the plurality of second under-bump patterns.

* * * * *